(12) United States Patent
DeLouise et al.

(10) Patent No.: US 6,273,985 B1
(45) Date of Patent: Aug. 14, 2001

(54) BONDING PROCESS

(75) Inventors: Lisa A. DeLouise; David J. Luca, both of Rochester, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/105,501

(22) Filed: Jun. 26, 1998

(51) Int. Cl.$^7$ ................................................. B32B 31/28
(52) U.S. Cl. ........................ 156/273.3; 156/273.5; 156/275.5; 156/275.7; 430/286.1; 522/135; 522/172
(58) Field of Search .................. 156/273.3, 273.5, 156/275.1, 275.3, 275.5, 275.7, 330, 327; 522/135, 172; 430/281.1, 286.1, 287.1

(56) References Cited

U.S. PATENT DOCUMENTS

| | | | |
|---|---|---|---|
| 4,608,333 | * 8/1986 | Ohbayashi et al. | 430/281.1 |
| 4,739,032 | 4/1988 | Jones | 528/230 |
| 5,738,799 | 4/1998 | Hawkins et al. | 216/27 |
| 5,739,254 | 4/1998 | Fuller et al. | 528/125 |
| 6,083,661 | * 7/2000 | Oaks et al. | 430/286.1 |

FOREIGN PATENT DOCUMENTS

| | | |
|---|---|---|
| 0 826 700 A2 | 3/1998 | (EP). |
| 0 827 026 A2 | 3/1998 | (EP). |
| 0 827 027 A2 | 3/1998 | (EP). |
| 0 827 028 A2 | 3/1998 | (EP). |
| 0 827 029 A2 | 3/1998 | (EP). |
| 0 827 030 A2 | 3/1998 | (EP). |
| 0 827 031 A2 | 3/1998 | (EP). |
| 0 827 032 A2 | 3/1998 | (EP). |
| 0 827 033 A2 | 3/1998 | (EP). |

* cited by examiner

*Primary Examiner*—Michael W. Ball
*Assistant Examiner*—Michael A. Tolin
(74) *Attorney, Agent, or Firm*—Judith L. Byorick

(57) ABSTRACT

Disclosed is a process for bonding a first article to a second article which comprises (a) providing a first article comprising a polymer having photosensitivity-imparting substituents; (b) providing a second article comprising metal, plasma nitride, silicon, or glass; (c) applying to at least one of the first article and the second article an adhesion promoter selected from silanes, titanates, or zirconates having (i) alkoxy, aryloxy, or arylalkyloxy functional groups and (ii) functional groups including at least one photosensitive aliphatic >C=C< linkage; (d) placing the first article in contact with the second article; and (e) exposing the first article, second article, and adhesion promoter to radiation, thereby bonding the first article to the second article with the adhesion promote. In one embodiment of the present invention, the adhesion promoter is employed in microelectrical mechanical systems such as thermal ink jet printheads.

18 Claims, 3 Drawing Sheets

BONDING PROCESS

BACKGROUND OF THE INVENTION

The present invention is directed to a process for bonding articles of specific polymers to other articles with an adhesion promoter. More specifically, the present invention is directed to a process for bonding an article comprising a polymer having photosensitivity-imparting substituents to a second article comprising metal, silicon, plasma nitride, or glass with an adhesion promoter which is a titanium, zirconium, or silicon compound. One embodiment of the present invention is directed to a process for bonding a first article to a second article which comprises (a) providing a first article comprising a polymer having photosensitivity-imparting substituents; (b) providing a second article comprising metal, plasma nitride, silicon, or glass; (c) applying to at least one of the first article and the second article an adhesion promoter selected from silanes, titanates, or zirconates having (i) alkoxy, aryloxy, or arylalkyloxy functional groups and (ii) functional groups including at least one photosensitive aliphatic >C=C< linkage; (d) placing the first article in contact with the second article; and (e) exposing the first article, second article, and adhesion promoter to radiation, thereby bonding the first article to the second article with the adhesion promoter. Another embodiment of the present invention is directed to an ink jet printhead which comprises (i) an upper substrate with a set of parallel grooves for subsequent use as ink channels and a recess for subsequent use as a manifold, the grooves being open at one end for serving as droplet emitting nozzles, (ii) a lower substrate in which one surface thereof has an array of heating elements and addressing electrodes formed thereon, at least a portion of said surface comprising metal, plasma nitride, silicon, or glass, and (iii) an insulative layer deposited on the surface of the lower substrate and over the heating elements and addressing electrodes and patterned to form recesses therethrough to expose the heating elements and terminal ends of the addressing electrodes, the upper and lower substrates being aligned, mated, and bonded together to form the printhead with the grooves in the upper substrate being aligned with the heating elements in the lower substrate to form droplet emitting nozzles, said insulative layer comprising a crosslinked or chain extended polymer wherein the crosslinking or chain extension is at least partly through photosensitivity-imparting substituents; said insulative layer being bonded to the surface of the lower substrate with an adhesion promoter selected from silanes, titanates, or zirconates having (a) alkoxy, aryloxy, or arylalkyloxy functional groups and (b) functional groups including at least one photosensitive aliphatic >C=C< linkage. Yet another embodiment of the present invention is directed to a process for forming an ink jet printhead which comprises (a) providing a lower substrate in which one surface thereof has an array of heating elements and addressing electrodes having terminal ends formed thereon, at least a portion of said surface comprising metal, plasma nitride, silicon, or glass; (b) depositing onto the surface of the lower substrate having the heating elements and addressing electrodes thereon an adhesion promoter selected from silanes, titanates, or zirconates having (i) alkoxy, aryloxy, or arylalkyloxy functional groups and (ii) functional groups including at least one photosensitive aliphatic >C=C< linkage; (c) depositing onto the surface of the lower substrate having the adhesion promoter thereon an insulative layer comprising a polymer having photosensitivity-imparting substituents, provided that the $R_2$ group of the adhesion promoter contains a functional group which is capable of reacting with the material selected for the insulative layer; (d) exposing the adhesion promoter and the insulative layer to actinic radiation in an imagewise pattern such that the polymer comprising the insulative layer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes, and wherein the insulative layer is bonded to the lower substrate with the adhesion promoter in exposed areas; (e) removing the adhesion promoter and the polymer from the unexposed areas, thereby forming recesses in the layer, said recesses exposing the heating elements and the terminal ends of the addressing electrodes; (f) providing an upper substrate with a set of parallel grooves for subsequent use as ink channels and a recess for subsequent use as a manifold, the grooves being open at one end for serving as droplet emitting nozzles; and (g) aligning, mating, and bonding the upper and lower substrates together to form a printhead with the grooves in the upper substrate being aligned with the heating elements in the lower substrate to form droplet emitting nozzles, thereby forming a thermal ink jet printhead. Still another embodiment of the present invention is directed to an ink jet printhead which comprises (i) an upper substrate with a set of parallel grooves for subsequent use as ink channels and a recess for subsequent use as a manifold, the grooves being open at one end for serving as droplet emitting nozzles, (ii) a lower substrate in which one surface thereof has an array of heating elements and addressing electrodes formed thereon, at least a portion of said surface comprising metal, plasma nitride, silicon, or glass, and (iii) an insulative layer deposited on the surface of the lower substrate and over the heating elements and addressing electrodes and patterned to form recesses therethrough to expose the heating elements and terminal ends of the addressing electrodes, the upper and lower substrates being aligned, mated, and bonded together to form the printhead with the grooves in the upper substrate being aligned with the heating elements in the lower substrate to form droplet emitting nozzles, said insulative layer comprising (a) a crosslinked or chain extended polymer wherein the crosslinking or chain extension is at least partly through photosensitivity-imparting substituents, and (b) an adhesion promoter selected from silanes, titanates, or zirconates having (1) alkoxy, aryloxy, or arylalkyloxy functional groups and (2) functional groups including at least one photosensitive aliphatic >C=C< linkage. Another embodiment of the present invention is directed to a process for forming an ink jet printhead which comprises (a) providing a lower substrate in which one surface thereof has an array of heating elements and addressing electrodes having terminal ends formed thereon, at least a portion of said surface comprising metal, plasma nitride, silicon, or glass; (b) depositing onto the surface of the lower substrate an insulative layer comprising (i) a polymer having photosensitivity-imparting substituents, and (ii) an adhesion promoter selected from silanes, titanates, or zirconates having (A) alkoxy, aryloxy, or arylalkyloxy functional groups and (B) functional groups including at least one photosensitive aliphatic >C=C< linkage; (c) exposing the insulative layer to actinic radiation in an imagewise pattern such that the polymer comprising the insulative layer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes, and wherein the insulative layer is bonded to the lower substrate in exposed areas; (d) removing the adhesion promoter and the polymer from the unexposed areas, thereby forming recesses in the layer, said recesses exposing the heating elements and the terminal ends of the addressing electrodes; (e) providing an upper substrate with a set of parallel grooves for subsequent use as ink channels and a recess for subsequent use as a manifold, the grooves being open at one end for serving as droplet emitting nozzles; and (f) aligning, mating, and bonding the upper and lower substrates together to form a printhead with the grooves in the upper substrate being aligned with the heating elements in the lower substrate to form droplet emitting nozzles, thereby forming a thermal ink jet printhead.

In microelectronics applications, such as microelectrical mechanical systems (MEMS), there is a great need for low dielectric constant, high glass transition temperature, thermally stable, photopatternable polymers for use as interlayer dielectric layers and as passivation layers which protect microelectronic circuitry. Poly(imides) are widely used to satisfy these needs; these materials, however, have disadvantageous characteristics such as relatively high water sorption and hydrolytic instability. There is thus a need for high performance polymers which can be effectively photopatterned and developed at high resolution.

One particular application for such materials is the fabrication of ink jet printheads. Ink jet printing systems generally are of two types: continuous stream and drop-on-demand. In continuous stream ink jet systems, ink is emitted in a continuous stream under pressure through at least one orifice or nozzle. The stream is perturbed, causing it to break up into droplets at a flexed distance from the orifice. At the break-up point, the droplets are charged in accordance with digital data signals and passed through an electrostatic field which adjusts the trajectory of each droplet in order to direct it to a gutter for recirculation or a specific location on a recording medium. In drop-on-demand systems, a droplet is expelled from an orifice directly to a position on a recording medium in accordance with digital data signals. A droplet is not formed or expelled unless it is to be placed on the recording medium.

Since drop-on-demand systems require no ink recovery, charging, or deflection, the system is much simpler than the continuous stream type. There are different types of drop-on-demand ink jet systems. One type of drop-on-demand system has as its major components an ink filled channel or passageway having a nozzle on one end and a piezoelectric transducer near the other end to produce pressure pulses. The relatively large size of the transducer prevents close spacing of the nozzles, and physical limitations of the transducer result in low ink drop velocity. Low drop velocity seriously diminishes tolerances for drop velocity variation and directionality, thus impacting the system's ability to produce high quality copies. Drop-on-demand systems which use piezoelectric devices to expel the droplets also suffer the disadvantage of a slow printing speed.

The other type of drop-on-demand system is known as thermal ink jet, or bubble jet, and produces high velocity droplets and allows very close spacing of nozzles. The major components of this type of drop-on-demand system are an ink filled channel having a nozzle on one end and a heat generating resistor near the nozzle. Printing signals representing digital information originate an electric current pulse in a resistive layer within each ink passageway near the orifice or nozzle, causing the ink in the immediate vicinity to vaporize almost instantaneously and create a bubble. The ink at the orifice is forced out as a propelled droplet as the bubble expands. When the hydrodynamic motion of the ink stops, the process is ready to start all over again. With the introduction of a droplet ejection system based upon thermally generated bubbles, commonly referred to as the "bubble jet" system, the drop-on-demand ink jet printers provide simpler, lower cost devices than their continuous stream counterparts, and yet have substantially the same high speed printing capability.

The operating sequence of the bubble jet system begins with a current pulse through the resistive layer in the ink filled channel, the resistive layer being in close proximity to the orifice or nozzle for that channel. Heat is transferred from the resistor to the ink. The ink becomes superheated far above its normal boiling point, and for water based ink, finally reaches the critical temperature for bubble formation or nucleation of around 280° C. Once nucleated, the bubble or water vapor thermally isolates the ink from the heater and no further heat can be applied to the ink. This bubble expands until all the heat stored in the ink in excess of the normal boiling point diffuses away or is used to convert liquid to vapor, which removes heat due to heat of vaporization. The expansion of the bubble forces a droplet of ink out of the nozzle, and once the excess heat is removed, the bubble collapses. At this point, the resistor is no longer being heated because the current pulse has passed and, concurrently with the bubble collapse, the droplet is propelled at a high rate of speed in a direction towards a recording medium. The surface of the printhead encounters a severe cavitational force by the collapse of the bubble, which tends to erode it. Subsequently, the ink channel refills by capillary action. This entire bubble formation and collapse sequence occurs in about 10 microseconds. The channel can be refired after 100 to 500 microseconds minimum dwell time to enable the channel to be refilled and to enable the dynamic refilling factors to become somewhat dampened. Thermal ink jet equipment and processes are well known and are described in, for example, U.S. Pat. No. 4,601,777, U.S. Pat. No. 4,251,824, U.S. Pat. No. 4,410,899, U.S. Pat. No. 4,412,224, U.S. Pat. No. 4,532,530, and U.S. Pat. No. 4,774,530, the disclosures of each of which are totally incorporated herein by reference.

The present invention is suitable for ink jet printing processes, including drop-on-demand systems such as thermal ink jet printing, piezoelectric drop-on-demand printing, and the like.

In ink jet printing, a printhead is usually provided having one or more ink-filled channels communicating with an ink supply chamber at one end and having an opening at the opposite end, referred to as a nozzle. These printheads form images on a recording medium such as paper by expelling droplets of ink from the nozzles onto the recording medium. The ink forms a meniscus at each nozzle prior to being expelled in the form of a droplet. After a droplet is expelled, additional ink surges to the nozzle to reform the meniscus.

In thermal ink jet printing, a thermal energy generator, usually a resistor, is located in the channels near the nozzles a predetermined distance therefrom. The resistors are individually addressed with a current pulse to momentarily vaporize the ink and form a bubble which expels an ink droplet. As the bubble grows, the ink bulges from the nozzle and is contained by the surface tension of the ink as a meniscus. The rapidly expanding vapor bubble pushes the column of ink filling the channel towards the nozzle. At the end of the current pulse the heater rapidly cools and the vapor bubble begins to collapse. However, because of inertia, most of the column of ink that received an impulse from the exploding bubble continues its forward motion and is ejected from the nozzle as an ink drop. As the bubble begins to collapse, the ink still in the channel between the nozzle and bubble starts to move towards the collapsing bubble, causing a volumetric contraction of the ink at the nozzle and resulting in the separation of the bulging ink as a droplet. The acceleration of the ink out of the nozzle while the bubble is growing provides the momentum and velocity of the droplet in a substantially straight line direction towards a recording medium, such as paper.

Ink jet printheads include an array of nozzles and may, for example, be formed of silicon wafers using orientation dependent etching (ODE) techniques. The use of silicon wafers is advantageous because ODE techniques can form structures, such as nozzles, on silicon wafers in a highly precise manner. Moreover, these structures can be fabricated efficiently at low cost. The resulting nozzles are generally triangular in cross-section. Thermal ink jet printheads made by using the abovementioned ODE techniques typically comprise a channel plate which contains a plurality of nozzle-defining channels located on a lower surface thereof bonded to a heater plate having a plurality of resistive heater elements formed on an upper surface thereof and arranged so that a heater element is located in each channel. The upper surface of the heater plate typically includes an insulative layer which is patterned to form recesses exposing the individual heating elements. This insulative layer is referred to as a "pit layer" and is sandwiched between the channel plate and heater plate. For examples of printheads employing this construction, see U.S. Pat. No. 4,774,530 and U.S. Pat. No. 4,829,324, the disclosures of each of which are totally incorporated herein by reference. Additional examples of thermal ink jet printheads are disclosed in, for example, U.S. Pat. No. 4,835,553, U.S. Pat. No. 5,057,853, and U.S. Pat. No. 4,678,529, the disclosures of each of which are totally incorporated herein by reference.

In thermal ink jet printheads, polyimides are commonly used for electronic passivation and for defining the fluid path. The polyimide layer typically is bonded between the channel plate, which frequently is fabricated of silicon, and the heater wafer. In many instances, a trialkoxysilane based coupling agent is used to promote adhesion of the polyimide to the heater wafer, which often is passivated with materials such as phosphosilicate glass. The principle mechanism by which the silane coupling agent works is condensation of the silane with polar hydroxy groups that exist on the phosphosilicate glass surface. Prior to deposition onto the heater wafer substrate, the trialkoxysilane can be converted to the trisilanol $(HO)_3SiR$ form. The silane is spin cast onto the hydroxyl covered substrate and heated. The condensation reaction produces water and/or alcohol reaction products when Si—O—Si bonds form. Although Si—O—Si is a strong covalent bond, under acidic or basic conditions the condensation/hydrolysis equilibrium can be pushed toward hydrolysis, and delamination can occur. For effective silane-based adhesion promotion, an adequate number of substrate-polymer bonds must form in addition to a highly 2D or 3D crosslinked siloxane network. In this instance, the probability that all Si—O—Si bonds will hydrolyze simultaneously is reduced.

U.S. Pat. No. 5,739,254, filed Aug. 29, 1996, entitled "Process for Haloalkylation of High Performance Polymers," with the named inventors Timothy J. Fuller, Ram S. Narang, Thomas W. Smith, David J. Luca, and Raymond K. Crandall, and European Patent Publication 0,826,700, the disclosures of each of which are totally incorporated herein by reference, disclose a process which comprises reacting a polymer of the general formula

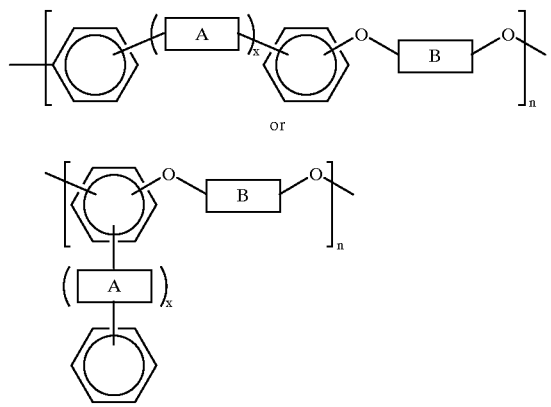

wherein x is an integer of 0 or 1, A is one of several specified groups, such as

B is one of several specified groups, such as

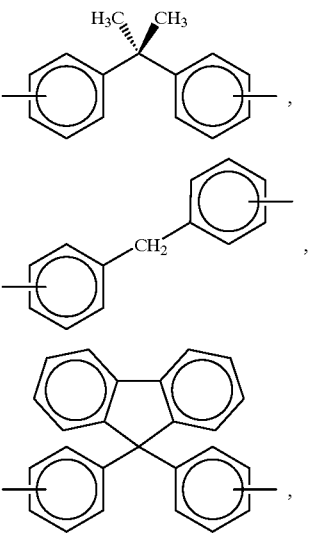

or mixtures thereof, and n is an integer representing the number of repeating monomer units, with an acetyl halide and dimethoxymethane in the presence of a halogen-containing Lewis acid catalyst and methanol, thereby forming a haloalkylated polymer. In a specific embodiment, the haloalkylated polymer is then reacted further to replace at least some of the haloalkyl groups with photosensitivity-imparting groups. Also disclosed is a process for preparing a thermal ink jet printhead with the aforementioned polymer.

U.S. Pat. No. 5,738,799, filed Sep. 12, 1996, the disclosure of which is totally incorporated herein by reference, discloses an ink-jet printhead fabrication technique which enables capillary channels for liquid ink to be formed with square or rectangular cross-sections. A sacrificial layer is placed over the main surface of a silicon chip, the sacrificial layer being patterned in the form of the void formed by the desired ink channels. A permanent layer, comprising permanent material, is applied over the sacrificial layer, and, after polishing the two layers to form a uniform surface, the sacrificial layer is removed. Preferred materials for the sacrificial layer include polyimide while preferred materials for the permanent layer include polyarylene ether, although a variety of material combinations are possible.

Copending application U.S. Ser. No. 08/705,914, filed Aug. 29, 1996, entitled "Thermal Ink Jet Printhead With Ink Resistant Heat Sink Coating," with the named inventors Ram S. Narang and Timothy J. Fuller, the disclosure of which is totally incorporated herein by reference, discloses a heat sink for a thermal ink jet printhead having improved resistance to the corrosive effects of ink by coating the surface of the heat sink with an ink resistant film formed by electrophoretically depositing a polymeric material on the heat sink surface. In one described embodiment, a thermal ink jet printer is formed by bonding together a channel plate and a heater plate. Resistors and electrical connections are formed in the surface of the heater plate. The heater plate is bonded to a heat sink comprising a zinc substrate having an electrophoretically deposited polymeric film coating. The film coating provides resistance to the corrosion of higher pH inks. In another embodiment, the coating has conductive fillers dispersed therethrough to enhance the thermal conductivity of the heat sink. In one embodiment, the polymeric material is selected from the group consisting of polyethersulfones, polysulfones, polyamides, polyimides, polyamide-imides, epoxy resins, polyetherimides, polyarylene ether ketones, chloromethylated polyarylene ether ketones, acryloylated polyarylene ether ketones, polystyrene and mixtures thereof.

Copending application U.S. Ser. No. 08/703,138, filed Aug. 29, 1996, entitled "Method for Applying an Adhesive Layer to a Substrate Surface," with the named inventors Ram S. Narang, Stephen F. Pond, and Timothy J. Fuller, the disclosure of which is totally incorporated herein by reference, discloses a method for uniformly coating portions of the surface of a substrate which is to be bonded to another substrate. In a described embodiment, the two substrates are channel plates and heater plates which, when bonded together, form a thermal ink jet printhead. The adhesive layer is electrophoretically deposited over a conductive pattern which has been formed on the binding substrate surface. The conductive pattern forms an electrode and is placed in an electrophoretic bath comprising a colloidal emulsion of a preselected polymer adhesive. The other electrode is a metal container in which the solution is placed or a conductive mesh placed within the container. The electrodes are connected across a voltage source and a field is applied. The substrate is placed in contact with the solution, and a small current flow is carefully controlled to create an extremely uniform thin deposition of charged adhesive micelles on the surface of the conductive pattern. The substrate is then removed and can be bonded to a second substrate and cured. In one embodiment, the polymer adhesive is selected from the group consisting of polyamides, polyimides, polyamide-imides, epoxy resins, polyetherimides, polysulfones, polyether sulfones, polyarylene ether ketones, polystyrenes, chloromethylated polyarylene ether ketones, acryloylated polyarylene ether ketones, and mixtures thereof.

Copending application U.S. Ser. No. 08/697,750, filed Aug. 29, 1996, entitled "Electrophoretically Deposited Coating For the Front Face of an Ink Jet Printhead," with the named inventors Ram S. Narang, Stephen F. Pond, and Timothy J. Fuller, the disclosure of which is totally incorporated herein by reference, discloses an electrophoretic deposition technique for improving the hydrophobicity of a metal surface, in one embodiment, the front face of a thermal ink jet printhead. For this example, a thin metal layer is first deposited on the front face. The front face is then lowered into a colloidal bath formed by a fluorocarbon-doped organic system dissolved in a solvent and then dispersed in a non-solvent. An electric field is created and a small amount of current through the bath causes negatively charged particles to be deposited on the surface of the metal coating. By controlling the deposition time and current strength, a very uniform coating of the fluorocarbon compound is formed on the metal coating. The electrophoretic coating process is conducted at room temperature and enables a precisely controlled deposition which is limited only to the front face without intrusion into the front face orifices. In one embodiment, the organic compound is selected from the group consisting of polyimides, polyamides, polyamide-imides, polysulfones, polyarylene ether ketones, polyethersulfones, polytetrafluoroethylenes, polyvinylidene fluorides, polyhexafluoropropylenes, epoxies, polypentafluorostyrenes, polystyrenes, copolymers thereof, terpolymers thereof, and mixtures thereof.

Copending application U.S. Ser. No. 08/705,916, filed Aug. 29, 1996, entitled "Stabilized Graphite Substrates," with the named inventors Gary A. Kneezel, Ram S. Narang, Timothy J. Fuller, and Peter J. John, the disclosure of which is totally incorporated herein by reference, discloses an apparatus which comprises at least one semiconductor chip mounted on a substrate, said substrate comprising a graphite member having electrophoretically deposited thereon a coating of a polymeric material. In one embodiment, the semiconductor chips are thermal ink jet printhead subunits. In one embodiment, the polymeric material is of the general formula

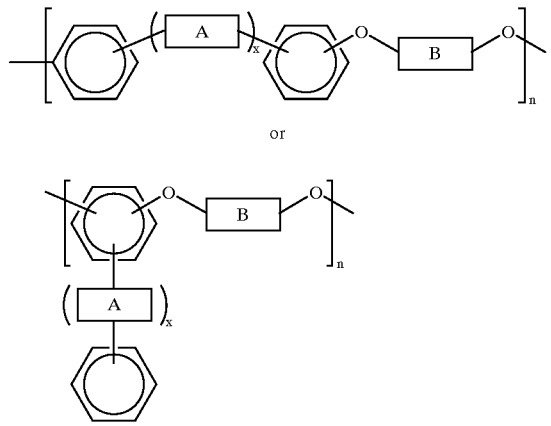

or wherein x is an integer of 0 or 1, A is one of several specified groups, such as

B is one of several specified groups, such as

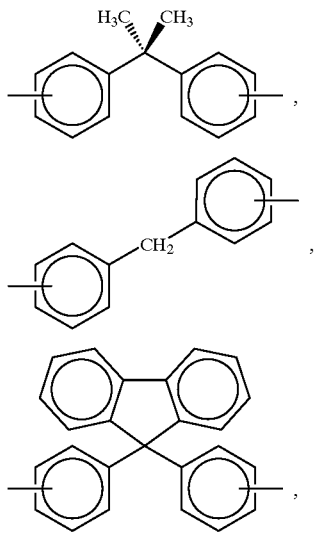

or mixtures thereof, and n is an integer representing the number of repeating monomer units.

Copending application U.S. Ser. No. 08/705,375, filed Aug. 29, 1996, entitled "Improved Curable Compositions," with the named inventors Timothy J. Fuller, Ram S. Narang, Thomas W. Smith, David J. Luca, and Ralph A. Mosher, and European Patent Publication 0,827,027, the disclosures of each of which are totally incorporated herein by reference, disclose an improved composition comprising a photopatternable polymer containing at least some monomer repeat units with photosensitivity-imparting substituents, said photopatternable polymer being of the general formula

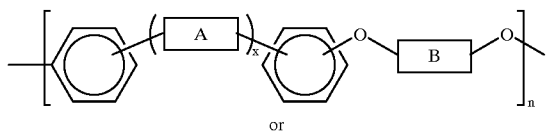

or

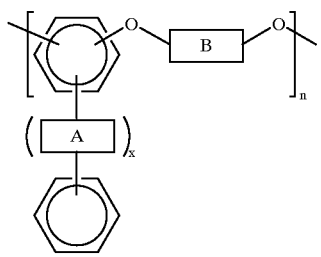

wherein x is an integer of 0 or 1, A is one of several specified groups such as

B is one of several specified groups, such as

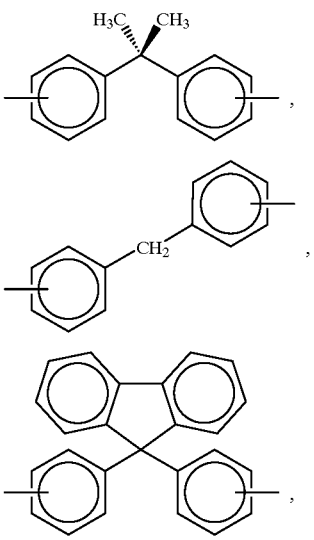

or mixtures thereof, and n is an integer representing the number of repeating monomer units. Also disclosed is a process for preparing a thermal ink jet printhead with the aforementioned polymer and a thermal ink jet printhead containing therein a layer of a crosslinked or chain extended polymer of the above formula.

Copending application U.S. Ser. No. 08/705,365, filed Aug. 29, 1996, entitled "Hydroxyalkylated High Performance Curable Polymers," with the named inventors Ram S. Narang and Timothy J. Fuller, and European Patent Publication 0,827,028, the disclosures of each of which are totally incorporated herein by reference, disclose a composition which comprises (a) a polymer containing at least some monomer repeat units with photosensitivity-imparting substituents which enable crosslinking or chain extension of the polymer upon exposure to actinic radiation, said polymer being of the formula

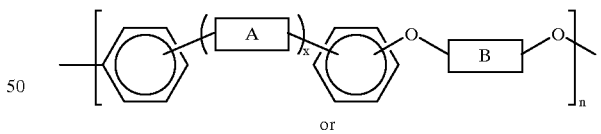

or

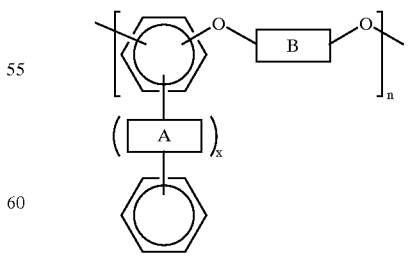

wherein x is an integer of 0 or 1, A is one of several specified groups, such as

B is one of several specified groups, such as

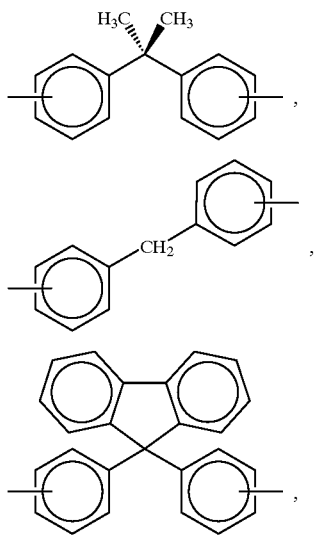

or mixtures thereof, and n is an integer representing the number of repeating monomer units, wherein said photosensitivity-imparting substituents are hydroxyalkyl groups; (b) at least one member selected from the group consisting of photoinitiators and sensitizers; and (c) an optional solvent. Also disclosed are processes for preparing the above polymers and methods of preparing thermal ink jet printheads containing the above polymers.

Copending application U.S. Ser. No. 08/705,488, filed Aug. 29, 1996, entitled "Improved High Performance Polymer Compositions," with the named inventors Thomas W. Smith, Timothy J. Fuller, Ram S. Narang, and David J. Luca, and European Patent Publication 0,827,029, the disclosures of each of which are totally incorporated herein by reference, disclose a composition comprising a polymer with a weight average molecular weight of from about 1,000 to about 65,000, said polymer containing at least some monomer repeat units with a first, photosensitivity-imparting substituent which enables crosslinking or chain extension of the polymer upon exposure to actinic radiation, said polymer also containing a second, thermal sensitivity-imparting substituent which enables further polymerization of the polymer upon exposure to temperatures of about 140° C. and higher, wherein the first substituent is not the same as the second substituent, said polymer being selected from the group consisting of polysulfones, polyphenylenes, polyether sulfones, polyimides, polyamide imides, polyarylene ethers, polyphenylene sulfides, polyarylene ether ketones, phenoxy resins, polycarbonates, polyether imides, polyquinoxalines, polyquinolines, polybenzimidazoles, polybenzoxazoles, polybenzothiazoles, polyoxadiazoles, copolymers thereof, and mixtures thereof.

Copending application U.S. Ser. No. 08/697,761, filed Aug. 29, 1996, entitled "Process for Direct Substitution of High Performance Polymers with Unsaturated Ester Groups," with the named inventors Timothy J. Fuller, Ram S. Narang, Thomas W. Smith, David J. Luca, and Raymond K. Crandall, and European Patent Publication 0,827,030, the disclosures of each of which are totally incorporated herein by reference, disclose a process which comprises reacting a polymer of the general formula

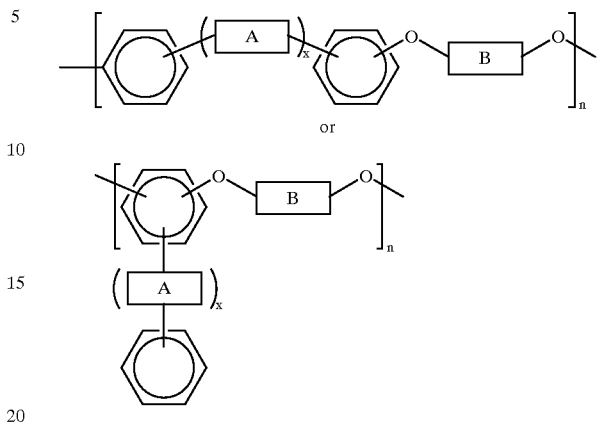

wherein x is an integer of 0 or 1, A is one of several specified groups, such as

B is one of several specified groups, such as

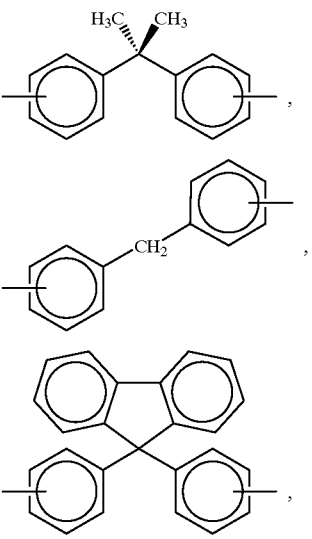

or mixtures thereof, and n is an integer representing the number of repeating monomer units, with (i) a formaldehyde source, and (ii) an unsaturated acid in the presence of an acid catalyst, thereby forming a curable polymer with unsaturated ester groups. Also disclosed is a process for preparing an ink jet printhead with the above polymer.

Copending application U.S. Ser. No. 08/705,479, filed Aug. 29, 1996, entitled "Processes for Substituting Haloalkylated Polymers With Unsaturated Ester, Ether, and Alkylcarboxymethylene Groups," with the named inventors Timothy J. Fuller, Ram S. Narang, Thomas W. Smith, David J. Luca, and Raymond K. Crandall, and European Patent Publication 0,827,026, the disclosures of each of which are totally incorporated herein by reference, disclose a process which comprises reacting a haloalkylated aromatic polymer with a material selected from the group consisting of unsaturated ester salts, alkoxide salts, alkylcarboxylate salts, and mixtures thereof, thereby forming a curable polymer having functional groups corresponding to the selected salt. Another embodiment of the invention is directed to a process for preparing an ink jet printhead with the curable polymer thus prepared.

Copending application U.S. Ser. No. 08/705,376, filed Aug. 29, 1996, entitled "Blends Containing Curable Polymers," with the named inventors Ram S. Narang and Timothy J. Fuller, and European Patent Publication 0,827,031, the disclosures of each of which are totally incorporated herein by reference, disclose a composition which comprises a mixture of (A) a first component comprising a polymer, at least some of the monomer repeat units of which have at least one photosensitivity-imparting group thereon, said polymer having a first degree of photosensitivity-imparting group substitution measured in milliequivalents of photosensitivity-imparting group per gram and being of the general formula

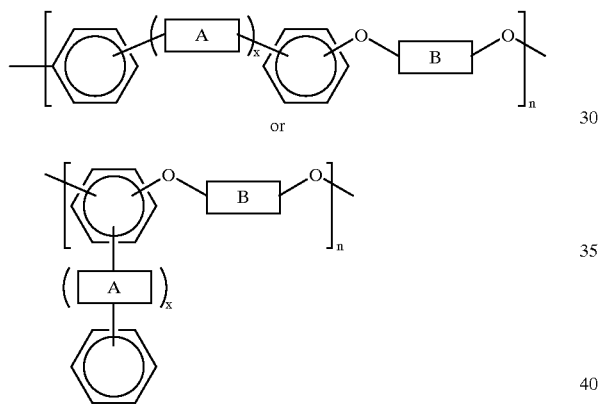

or wherein x is an integer of 0 or 1, A is one of several specified groups, such as

B is one of several specified groups, such as

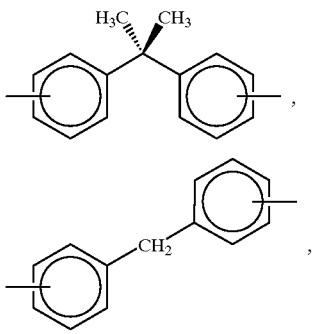

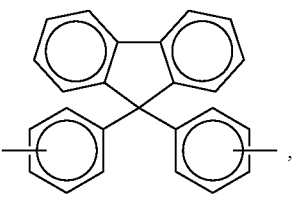

or mixtures thereof, and n is an integer representing the number of repeating monomer units, and (B) a second component which comprises either (1) a polymer having a second degree of photosensitivity-imparting group substitution measured in milliequivalents of photosensitivity-imparting group per gram lower than the first degree of photosensitivity-imparting group substitution, wherein said second degree of photosensitivity-imparting group substitution may be zero, wherein the mixture of the first component and the second component has a third degree of photosensitivity-imparting group substitution measured in milliequivalents of photosensitivity-imparting group per gram which is lower than the first degree of photosensitivity-imparting group substitution and higher than the second degree of photosensitivity-imparting group substitution, or (2) a reactive diluent having at least one photosensitivity-imparting group per molecule and having a fourth degree of photosensitivity-imparting group substitution measured in milliequivalents of photosensitivity-imparting group per gram, wherein the mixture of the first component and the second component has a fifth degree of photosensitivity-imparting group substitution measured in milliequivalents of photosensitivity-imparting group per gram which is higher than the first degree of photosensitivity-imparting group substitution and lower than the fourth degree of photosensitivity-imparting group substitution; wherein the weight average molecular weight of the mixture is from about 10,000 to about 50,000; and wherein the third or fifth degree of photosensitivity-imparting group substitution is from about 0.25 to about 2 milliequivalents of photosensitivity-imparting groups per gram of mixture. Also disclosed is a process for preparing a thermal ink jet printhead with the aforementioned composition.

Copending application U.S. Ser. No. 08/705,372, filed Aug. 29, 1996, entitled "High Performance Curable Polymers and Processes for the Preparation Thereof," with the named inventors Ram S. Narang and Timothy J. Fuller, and European Patent Publication 0,827,033, the disclosures of each of which are totally incorporated herein by reference, disclose a composition which comprises a polymer containing at least some monomer repeat units with photosensitivity-imparting substituents which enable crosslinking or chain extension of the polymer upon exposure to actinic radiation, said polymer being of the formula

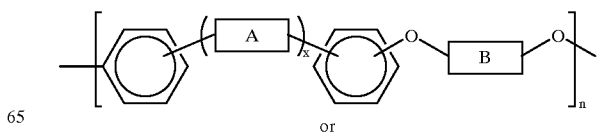

or

-continued

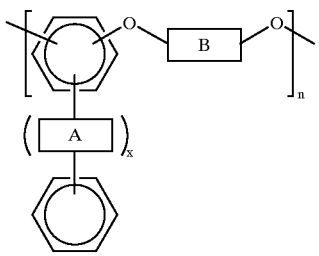

wherein x is an integer of 0 or 1, A is one of several specified groups, such as

B is one of several specified groups, such as

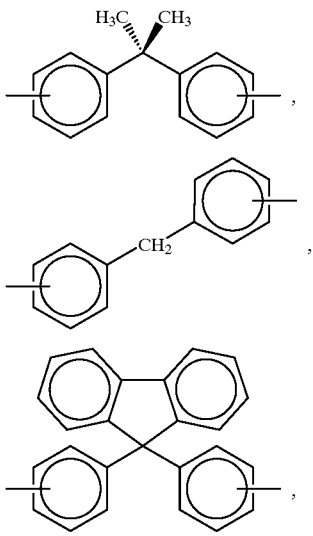

or mixtures thereof, and n is an integer representing the number of repeating monomer units, wherein said photosensitivity-imparting substituents are allyl ether groups, epoxy groups, or mixtures thereof. Also disclosed are a process for preparing a thermal ink jet printhead containing the aforementioned polymers and processes for preparing the aforementioned polymers.

Copending application U.S. Ser. No. 08/705,490, filed Aug. 29, 1996, entitled "Halomethylated High Performance Curable Polymers," with the named inventors Ram S. Narang and Timothy J. Fuller, the disclosure of which is totally incorporated herein by reference, discloses a process which comprises the steps of (a) providing a polymer containing at least some monomer repeat units with halomethyl group substituents which enable crosslinking or chain extension of the polymer upon exposure to a radiation source which is electron beam radiation, x-ray radiation, or deep ultraviolet radiation, said polymer being of the formula

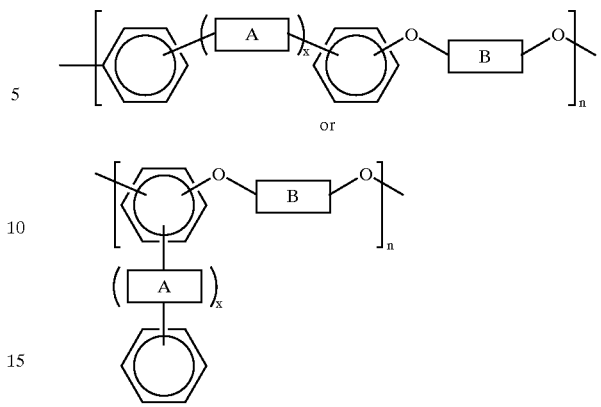

or wherein x is an integer of 0 or 1, A is one of several specified groups, such as

B is one of several specified groups, such as

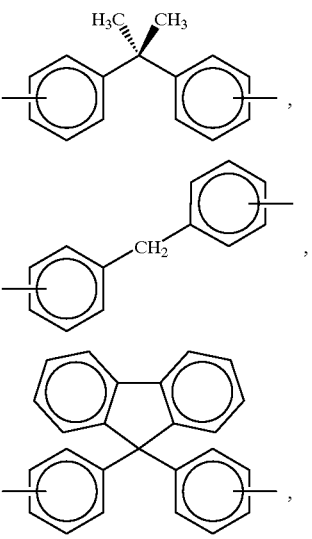

or mixtures thereof, and n is an integer representing the number of repeating monomer units, and (b) causing the polymer to become crosslinked or chain extended through the photosensitivity-imparting groups. Also disclosed is a process for preparing a thermal ink jet printhead by the aforementioned curing process.

Copending application U.S. Ser. No. 08/697,760, filed Aug. 29, 1996, entitled "Aqueous Developable High Performance Curable Polymers," with the named inventors Ram S. Narang and Timothy J. Fuller, and European Patent Publication 0,827,032, the disclosures of each of which are totally incorporated herein by reference, disclose a composition which comprises a polymer containing at least some monomer repeat units with water-solubility-imparting substituents and at least some monomer repeat units with photosensitivity-imparting substituents which enable crosslinking or chain extension of the polymer upon exposure to actinic radiation, said polymer being of the formula

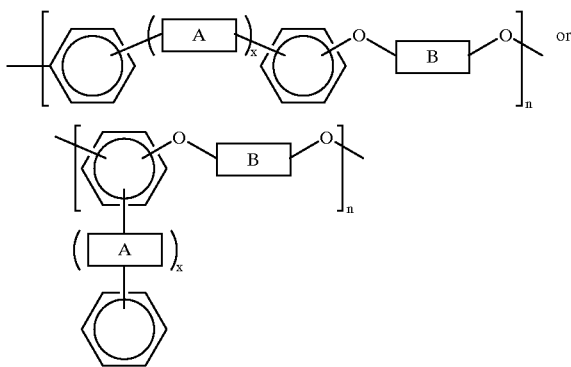

wherein x is an integer of 0 or 1, A is one of several specified groups, such as

B is one of several specified groups, such as

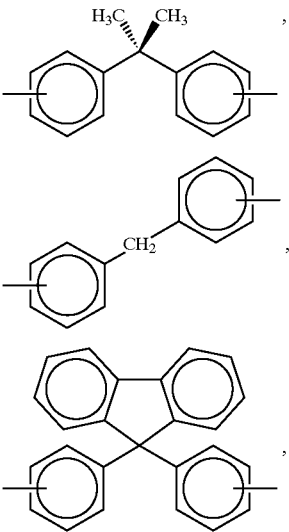

or mixtures thereof, and n is an integer representing the number of repeating monomer units. In one embodiment, a single functional group imparts both photosensitivity and water solubility to the polymer. In another embodiment, a first functional group imparts photosensitivity to the polymer and a second functional group imparts water solubility to the polymer. Also disclosed is a process for preparing a thermal ink jet printhead with the aforementioned polymers.

New photoresists have been discovered which can, in many instances, provide results superior to polyimides. These photoresists include polyarylene ethers, polyarylene ether ketones, polyarylene ether sulfones, and the like. Accordingly, while known compositions and processes are suitable for their intended purposes, a need remains for adhesion promoters particularly suitable for use with polyarylene photoresists. In addition, a need remains for adhesion promoters suitable for use with a wide variety of polymeric photoresists. Further, a need remains for adhesion promoters which enable good interfacial adhesion of photopatternable polymer films on surfaces such as metal, plasma nitride, silicon, and glass, including glass doped with phosphorus and/or boron. Additionally, a need remains for adhesion promoters which enable the formation of protective layers and fluid paths in ink jet printheads that are highly resistant to hydrolysis degradation. There is also a need for ink jet printheads which are resistant to delamination when exposed to aqueous inks having basic pH. In addition, a need remains for adhesion promoters in photopatternable articles which provide good layer adhesion during the development process during which portions of the photopatternable material are removed in an imagewise pattern, thereby reducing or eliminating undercutting and floating images (wherein portions of the photopatternable material which should remain intact become delaminated). Further, a need remains for adhesion promoters which have surface energies and surface characteristics that enable good wetting of the adhesion promoter surface by photopatternable polymers.

SUMMARY OF THE INVENTION

It is an object of the present invention to provide adhesion promoters and ink jet printheads with the above noted advantages.

It is another object of the present invention to provide adhesion promoters particularly suitable for use with polyarylene photoresists.

It is yet another object of the present invention to provide adhesion promoters suitable for use with a wide variety of polymeric photoresists.

It is still another object of the present invention to provide adhesion promoters which enable good interfacial adhesion of photopolymer films on surfaces such as metal, plasma nitride, silicon, and glass, including glass doped with phosphorus and/or boron.

Another object of the present invention is to provide adhesion promoters which enable the formation of protective layers and fluid paths in ink jet printheads that are highly resistant to hydrolysis degradation.

Yet another object of the present invention is to provide ink jet printheads which are resistant to delamination when exposed to aqueous inks having basic pH.

Still another object of the present invention is to provide adhesion promoters in photopatternable articles which provide good layer adhesion during the development process during which portions of the photopatternable material are removed in an imagewise pattern, thereby reducing or eliminating undercutting and floating images (wherein portions of the photopatternable material which should remain intact become delaminated).

It is another object of the present invention to provide adhesion promoters which have surface energies and surface characteristics that enable good wetting of the adhesion promoter surface by photopatternable polymers.

These and other objects of the present invention (or specific embodiments thereof) can be achieved by providing a process for bonding a first article to a second article which comprises (a) providing a first article comprising a polymer having photosensitivity-imparting substituents; (b) providing a second article comprising metal, plasma nitride, silicon, or glass; (c) applying to at least one of the first article and the second article an adhesion promoter selected from silanes, titanates, or zirconates having (i) alkoxy, aryloxy, or arylalkyloxy functional groups and (ii) functional groups including at least one photosensitive aliphatic >C=C< linkage; (d) placing the first article in contact with the second article; and (e) exposing the first article, second article, and adhesion promoter to radiation, thereby bonding the first article to the second article with the adhesion promoter. Another embodiment of the present invention is directed to an ink jet printhead which comprises (i) an upper substrate with a set of parallel grooves for subsequent use as ink channels and a recess for subsequent use as a manifold, the grooves being open at one end for serving as droplet emitting nozzles, (ii) a lower substrate in which one surface thereof has an array of heating elements and addressing electrodes formed thereon, at least a portion of said surface comprising metal, plasma nitride, silicon, or glass, and (iii) an insulative layer deposited on the surface of the lower substrate and over the heating elements and addressing electrodes and patterned to form recesses therethrough to expose the heating elements and terminal ends of the addressing electrodes, the upper and lower substrates being aligned, mated, and bonded together to form the printhead with the grooves in the upper substrate being aligned with the heating elements in the lower substrate to form droplet emitting nozzles, said insulative layer comprising a crosslinked or chain extended polymer wherein the crosslinking or chain extension is at least partly through photosensitivity-imparting substituents; said insulative layer being bonded to the surface of the lower substrate with an adhesion promoter selected from silanes, titanates, or zirconates having (a) alkoxy, aryloxy, or arylalkyloxy functional groups and (b) functional groups including at least one photosensitive aliphatic >C=C< linkage. Yet another embodiment of the present invention is directed to a process for forming an ink jet printhead which comprises (a) providing a lower substrate in which one surface thereof has an array of heating elements and addressing electrodes having terminal ends formed thereon, at least a portion of said surface comprising metal, plasma nitride, silicon, or glass; (b) depositing onto the surface of the lower substrate having the heating elements and addressing electrodes thereon an adhesion promoter selected from silanes, titanates, or zirconates having (i) alkoxy, aryloxy, or arylalkyloxy functional groups and (ii) functional groups including at least one photosensitive aliphatic >C=C< linkage; (c) exposing the adhesion promoter and the insulative layer to actinic radiation in an imagewise pattern such that the polymer comprising the insulative layer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes, and wherein the insulative layer is bonded to the lower substrate with the adhesion promoter in exposed areas; (d) removing the adhesion promoter and the polymer from the unexposed areas, thereby forming recesses in the layer, said recesses exposing the heating elements and the terminal ends of the addressing electrodes; (e) providing an upper substrate with a set of parallel grooves for subsequent use as ink channels and a recess for subsequent use as a manifold, the grooves being open at one end for serving as droplet emitting nozzles; and (f) aligning, mating, and bonding the upper and lower substrates together to form a printhead with the grooves in the upper substrate being aligned with the heating elements in the lower substrate to form droplet emitting nozzles, thereby forming a thermal ink jet printhead. Still another embodiment of the present invention is directed to an ink jet printhead which comprises (i) an upper substrate with a set of parallel grooves for subsequent use as ink channels and a recess for subsequent use as a manifold, the grooves being open at one end for serving as droplet emitting nozzles, (ii) a lower substrate in which one surface thereof has an array of heating elements and addressing electrodes formed thereon, at least a portion of said surface comprising metal, plasma nitride, silicon, or glass, and (iii) an insulative layer deposited on the surface of the lower substrate and over the heating elements and addressing electrodes and patterned to form recesses therethrough to expose the heating elements and terminal ends of the addressing electrodes, the upper and lower substrates being aligned, mated, and bonded together to form the printhead with the grooves in the upper substrate being aligned with the heating elements in the lower substrate to form droplet emitting nozzles, said insulative layer comprising (a) a crosslinked or chain extended polymer wherein the crosslinking or chain extension is at least partly through photosensitivity-imparting substituents, and (b) an adhesion promoter selected from silanes, titanates, or zirconates having (1) alkoxy, aryloxy, or arylalkyloxy functional groups and (2) functional groups including at least one photosensitive aliphatic >C=C< linkage. Another embodiment of the present invention is directed to a process for forming an ink jet printhead which comprises (a) providing a lower substrate in which one surface thereof has an array of heating elements and addressing electrodes having terminal ends formed thereon, at least a portion of said surface comprising metal, plasma nitride, silicon, or glass; (b) depositing onto the surface of the lower substrate an insulative layer comprising (i) a polymer having photosensitivity-imparting substituents, and (ii) an adhesion promoter selected from silanes, titanates, or zirconates having (A) alkoxy, aryloxy, or arylalkyloxy functional groups and (B) functional groups including at least one photosensitive aliphatic >C=C< linkage; (c) exposing the insulative layer to actinic radiation in an imagewise pattern such that the polymer comprising the insulative layer in exposed areas becomes crosslinked or chain extended and the polymer in unexposed areas does not become crosslinked or chain extended, wherein the unexposed areas correspond to areas of the lower substrate having thereon the heating elements and the terminal ends of the addressing electrodes, and wherein the insulative layer is bonded to the lower substrate in exposed areas; (d) removing the adhesion promoter and the polymer from the unexposed areas, thereby forming recesses in the layer, said recesses exposing the heating elements and the terminal ends of the addressing electrodes; (e) providing an upper substrate with a set of parallel grooves for subsequent use as ink channels and a recess for subsequent use as a manifold, the grooves being open at one end for serving as droplet emitting nozzles; and (f) aligning, mating, and bonding the upper and lower substrates together to form a printhead with the grooves in the upper substrate being aligned with the heating elements in the lower substrate to form droplet emitting nozzles, thereby forming a thermal ink jet printhead.

DETAILED DESCRIPTION OF THE INVENTION

Figure 1:
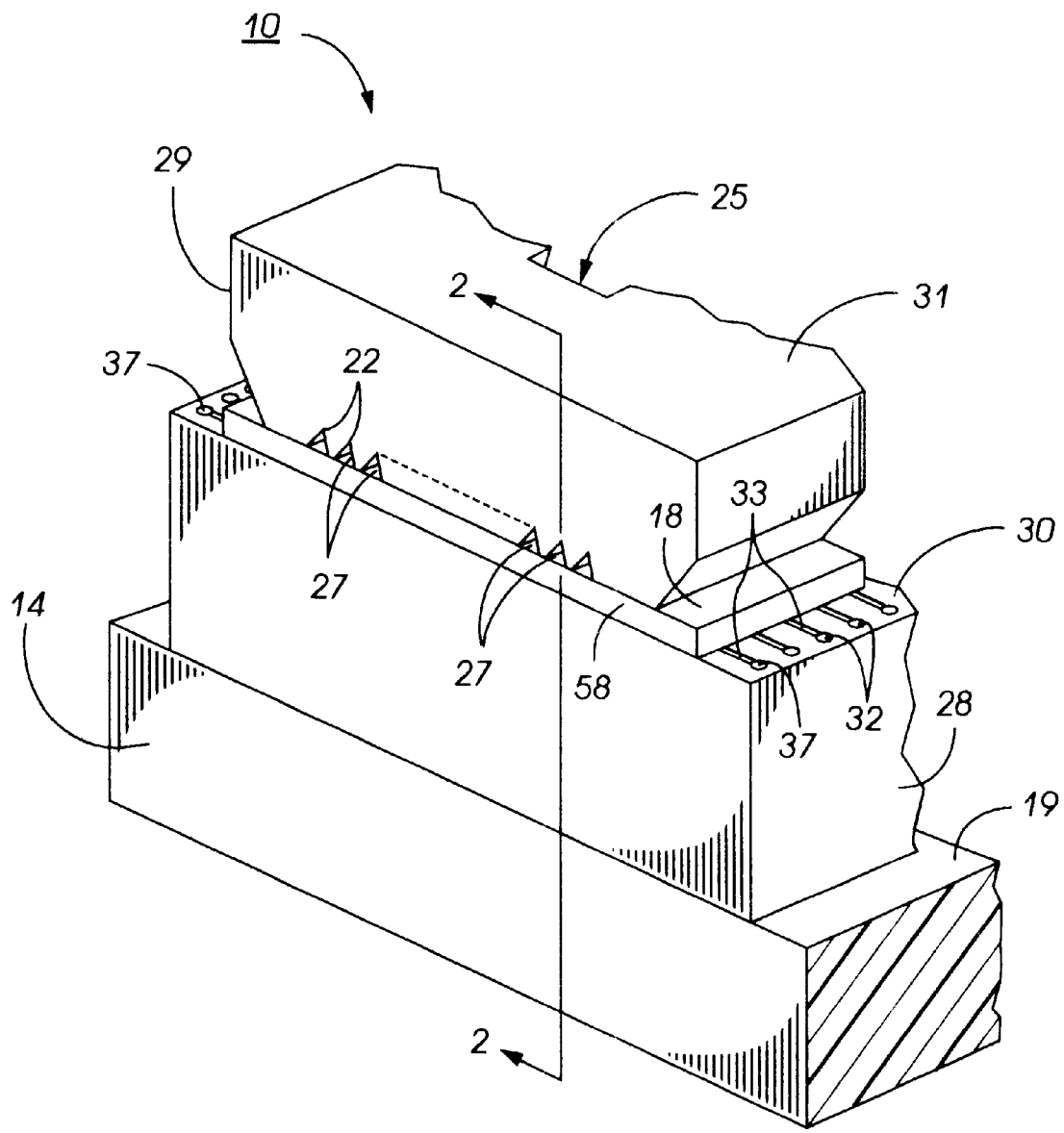
FIG. 1 is an enlarged schematic isometric view of an example of a printhead mounted on a daughter board showing the droplet emitting nozzles.

The process of the present invention can be used to bond any article of a polymer having photosensitivity-imparting substituents to a second article comprising metal, plasma nitride, silicon, or glass. Any glass may be employed; preferred glasses include those of silicon dioxide, silicon dioxide doped with phosphorus, silicon dioxide doped with boron, and silicon dioxide doped with phosphorus and boron. The adhesion promoter is applied to at least one of the two articles, followed by exposing the two articles and the adhesion promoter to radiation. Suitable radiation includes heat, electron beam radiation, light, such as ultraviolet light, or the like, with ultraviolet light being the preferred form of radiation. Exposure to radiation is believed to initiate crosslinking or chain extension of the polymer so that coupling occurs between the photosensitivity-imparting groups on the polymer and the active groups on the adhesion promoter, thereby forming a strong interfacial bond. For example, the process of the present invention can be used to bond together elements in microelectronic mechanical devices, such as thermal ink jet printheads.

The printheads of the present invention can be of any suitable configuration. An example of a suitable configuration, suitable in this instance for thermal ink jet printing, is illustrated schematically in FIG. 1, which depicts an enlarged, schematic isometric view of the front face 29 of a printhead 10 showing the array of droplet emitting nozzles 27. Referring also to FIG. 2, discussed later, the lower electrically insulating substrate or heating element plate 28 has the heating elements 34 and addressing electrodes 33 patterned on surface 30 thereof, while the upper substrate or channel plate 31 has parallel grooves 20 which extend in one direction and penetrate through the upper substrate front face edge 29. The other end of grooves 20 terminate at slanted wall 21, the floor 41 of the internal recess 24 which is used as the ink supply manifold for the capillary filled ink channels 20, has an opening 25 therethrough for use as an ink fill hole. The surface of the channel plate with the grooves are aligned and bonded to the heater plate 28, so that a respective one of the plurality of heating elements 34 is positioned in each channel, formed by the grooves and the lower substrate or heater plate. Ink enters the manifold formed by the recess 24 and the lower substrate 28 through the fill hole 25 and by capillary action, fills the channels 20 by flowing through an elongated recess 38 formed in the thick film insulative layer 18. The ink at each nozzle forms a meniscus, the surface tension of which prevents the ink from weeping therefrom. The addressing electrodes 33 on the lower substrate or channel plate 28 terminate at terminals 32. The upper substrate or channel plate 31 is smaller than that of the lower substrate in order that the electrode terminals 32 are exposed and available for wire bonding to the electrodes on the daughter board 19, on which the printhead 10 is permanently mounted. Layer 18 is a thick film passivation layer, discussed later, sandwiched between the upper and lower substrates. This layer is etched to expose the heating elements, thus placing them in a pit, and is etched to form the elongated recess to enable ink flow between the manifold 24 and the ink channels 20. In addition, the thick film insulative layer is etched to expose the electrode terminals.

Figure 2:
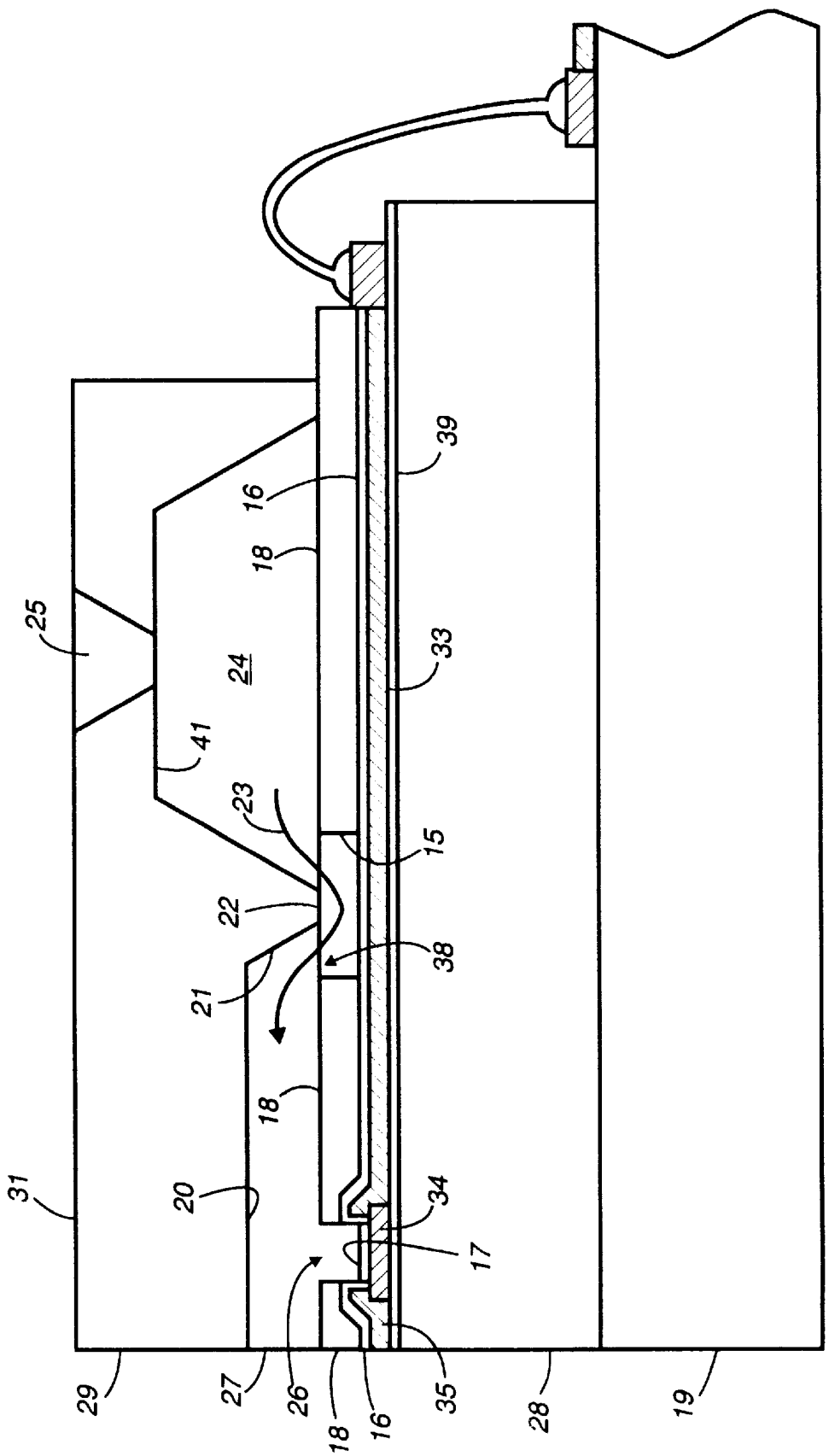
FIG. 2 is an enlarged cross-sectional view of FIG. 1 as viewed along the line 2—2 thereof and showing the electrode passivation and ink flow path between the manifold and the ink channels.

A cross sectional view of FIG. 1 is taken along view line 2—2 through one channel and shown as FIG. 2 to show how the ink flows from the manifold 24 and around the end 21 of the groove 20 as depicted by arrow 23. As is disclosed in U.S. Pat. No. 4,638,337, U.S. Pat. No. 4,601,777, and U.S. Pat. No. Re. 32,572, the disclosures of each of which are totally incorporated herein by reference, a plurality of sets of bubble generating heating elements 34 and their addressing electrodes 33 can be patterned on the polished surface of a single side polished (100) silicon wafer. Prior to patterning, the multiple sets of printhead electrodes 33, the resistive material that serves as the heating elements 34, and the common return 35, the polished surface of the wafer is coated with an underglaze layer 39 such as silicon dioxide, having a typical thickness of from about 5,000 Angstroms to about 2 microns, although the thickness can be outside this range. The resistive material can be a doped polycrystalline silicon, which can be deposited by chemical vapor deposition (CVD) or any other well known resistive material such as zirconium boride ($ZrB_2$). The common return and the addressing electrodes are typically aluminum leads deposited on the underglaze and over the edges of the heating elements. The common return ends or terminals 37 and addressing electrode terminals 32 are positioned at predetermined locations to allow clearance for wire bonding to the electrodes (not shown) of the daughter board 19, after the channel plate 31 is attached to make a printhead. The common return 35 and the addressing electrodes 33 are deposited to a thickness typically of from about 0.5 to about 3 microns, although the thickness can be outside this range, with the preferred thickness being 1.5 microns.

If polysilicon heating elements are used, they may be subsequently oxidized in steam or oxygen at a relatively high temperature, typically about 1,100° C. although the temperature can be above or below this value, for a period of time typically of from about 50 to about 80 minutes, although the time period can be outside this range, prior to the deposition of the aluminum leads, in order to convert a small portion of the polysilicon to $SiO_2$. In such cases, the heating elements are thermally oxidized to achieve an overglaze (not shown) of $SiO_2$ with a thickness typically of from about 500 Angstroms to about 1 micron, although the thickness can be outside this range, which has good integrity with substantially no pinholes.

In one embodiment, polysilicon heating elements are used and an optional silicon dioxide thermal oxide layer 17 is grown from the polysilicon in high temperature steam. The thermal oxide layer is typically grown to a thickness of from about 0.5 to about 1 micron, although the thickness can be outside this range, to protect and insulate the heating elements from the conductive ink. The thermal oxide is removed at the edges of the polysilicon heating elements for attachment of the addressing electrodes and common return, which are then patterned and deposited. If a resistive material such as zirconium boride is used for the heating elements, then other suitable well known insulative materials can be used for the protective layer thereover. Before electrode passivation, a tantalum (Ta) layer (not shown) can be optionally deposited, typically to a thickness of about 1 micron, although the thickness can be above or below this value, on the heating element protective layer 17 for added protection thereof against the cavitational forces generated by the collapsing ink vapor bubbles during printhead operation. The tantalum layer is etched off all but the protective layer 17 directly over the heating elements using, for example, $CF_4/O_2$ plasma etching. For polysilicon heating elements, the aluminum common return and addressing electrodes typically are deposited on the underglaze layer and over the opposing edges of the polysilicon heating elements which have been cleared of oxide for the attachment of the common return and electrodes.

For electrode passivation, a film 16 is deposited over the entire wafer surface, including the plurality of sets of heating elements and addressing electrodes. The passivation film 16 provides an ion barrier which will protect the exposed electrodes from the ink. Examples of suitable ion barrier materials for passivation film 16 include polyimide, plasma nitride, silicon, glass (including but not limited to silicon dioxide glasses), including glass doped with phosphorus and/or boron, materials disclosed hereinafter as being suitable for insulative layer 18, and the like, as well as any combinations thereof. An effective ion barrier layer is generally achieved when its thickness is from about 1000 Angstroms to about 10 microns, although the thickness can be outside this range. In 300 dpi printheads, passivation layer 16 preferably has a thickness of about 3 microns, although the thickness can be above or below this value. In 600 dpi printheads, the thickness of passivation layer 16 preferably is such that the combined thickness of layer 16 and layer 18 is about 25 microns, although the thickness can be above or below this value. The passivation film or layer 16 is etched off of the terminal ends of the common return and addressing electrodes for wire bonding later with the daughter board electrodes. This etching of the silicon dioxide film con be by either the wet or dry etching method. Alternatively, the electrode passivation can be by plasma deposited silicon nitride ($Si_3N_4$).

In one embodiment of the present invention, the adhesion promoter is next applied to layer 16. The adhesion promoter can be spin cast onto layer 16 from a solvent or mixture of solvents at an adhesion promoter concentration of from about 0.005 to about 10 percent by weight, and preferably from about 0.1 to about 1.0 percent by weight, although the concentration can be outside of these ranges. Typical solvents include water, methanol, isopropanol, glycol based solvents such as butyl carbitol, cellusolve, methyl cellusolve, xylene, N-methyl pyrrolidone, methyl ethyl ketone, and the like, as well as mixtures thereof. Silane adhesion promoters are typically cast from aqueous solvents, since hydrolysis of the alkoxy, aryloxy, or arylalkyloxy groups to reactive groups on the surface of layer 16 is desired. This result is best effected by reaction with water prior to spin casting, although trialkoxy containing silanes or partially hydrolyzed silanes may be directly applied to the wafer. After spin casting, heat treatment of the silane layer is typically carried out to effect the hydrolysis reaction of the silanol groups with surface hydroxyls. Typically, the zirconate and titanate adhesion promoters are already in the surface reactive form and can be spin cast directly from solvent. Heat activation is also not necessary with zirconate and titanate adhesion promoters, and in situations wherein the adhesion promoter has many photoactive groups, heat treatment can result in premature crosslinking within the adhesion promoter layer prior to contacting the insulating polymer layer 18. The spin rate and solution concentrations are adjusted to produce an adhesion promoter layer of the desired thickness. Typical adhesion promoter layer thicknesses range from as low as a monolayer (less than about 10 to about 100 nanometers) to many multilayers (about 0.5 to about 5.0 microns). Spin rates typically range from about 300 to about 3,000 rpm, and preferably from about 1,500 to about 2,000 rpm, although the rate can be outside of these ranges. After spin casting the silane adhesion promoter layer, the adhesion promoter typically is heat activated for from about 5 to about 15 minutes, typically at temperatures of from about 50 to about 100° C., to effect the bonding between the silane and layer 16.

In another embodiment of the present invention, the adhesion promoter is added directly to the insulating polymer solution used to form layer 18. In this instance, the optimum concentration of adhesion promoter in the solution can be determined by the mole fraction of the photoactive groups. Typically the adhesion promoter concentration in the polymer solution is in from about 1 to about 5 mole excess of the photoactive groups on the backbone of the photopatternable polymer monomers.

Next, a thick film type insulative layer 18, of a photopatternable polymeric material discussed in further detail herein, is formed on the passivation layer 16, typically having a thickness of from about 10 to about 100 microns and preferably in the range of from about 25 to about 50 microns, although the thickness can be outside these ranges. Even more preferably, in 300 dpi printheads, layer 18 preferably has a thickness of about 30 microns, and in 600 dpi printheads, layer 18 preferably has a thickness of from about 20 to about 22 microns, although other thicknesses can be employed. The insulative layer 18 is photolithographically processed to enable etching and removal of those portions of the layer 18 over each heating element (forming recesses 26), the elongated recess 38 for providing ink passage from the manifold 24 to the ink channels 20, and over each electrode terminal 32,37. Specifically, a mask is applied to the surface of layer 18 and layer 18 (along with the underlying adhesion promoter) is exposed to radiation at a wavelength to which the photopatternable polymer is sensitive, typically in the uv range. Subsequent to exposure, the areas of layer 18 (and the underlying adhesion promoter) which were exposed are crosslinked or chain extended and the areas of layer 18 (and the underlying adhesion promoter) which were not exposed remain in their original state and are easily removed. The elongated recess 38 is formed by the removal of this portion of the thick film layer 18. Thus, the passivation layer 16 alone protects the electrodes 33 from exposure to the ink in this elongated recess 38. Optionally, if desired, insulative layer 18 can be applied as a series of thin layers of either similar or different composition. Typically, a thin layer is deposited, photoexposed, partially cured, followed by deposition of the next thin layer, photoexposure, partial curing, and the like. The thin layers constituting thick film insulative layer 18 contain a polymer of the formula indicated hereinabove. In one embodiment of the present invention, a first thin layer is applied to contact layer 16, said first thin layer containing a mixture of a polymer of the formula indicated hereinabove and an epoxy polymer, followed by photoexposure, partial curing, and subsequent application of one or more successive thin layers containing a polymer of the formula indicated hereinabove.

Figure 3:
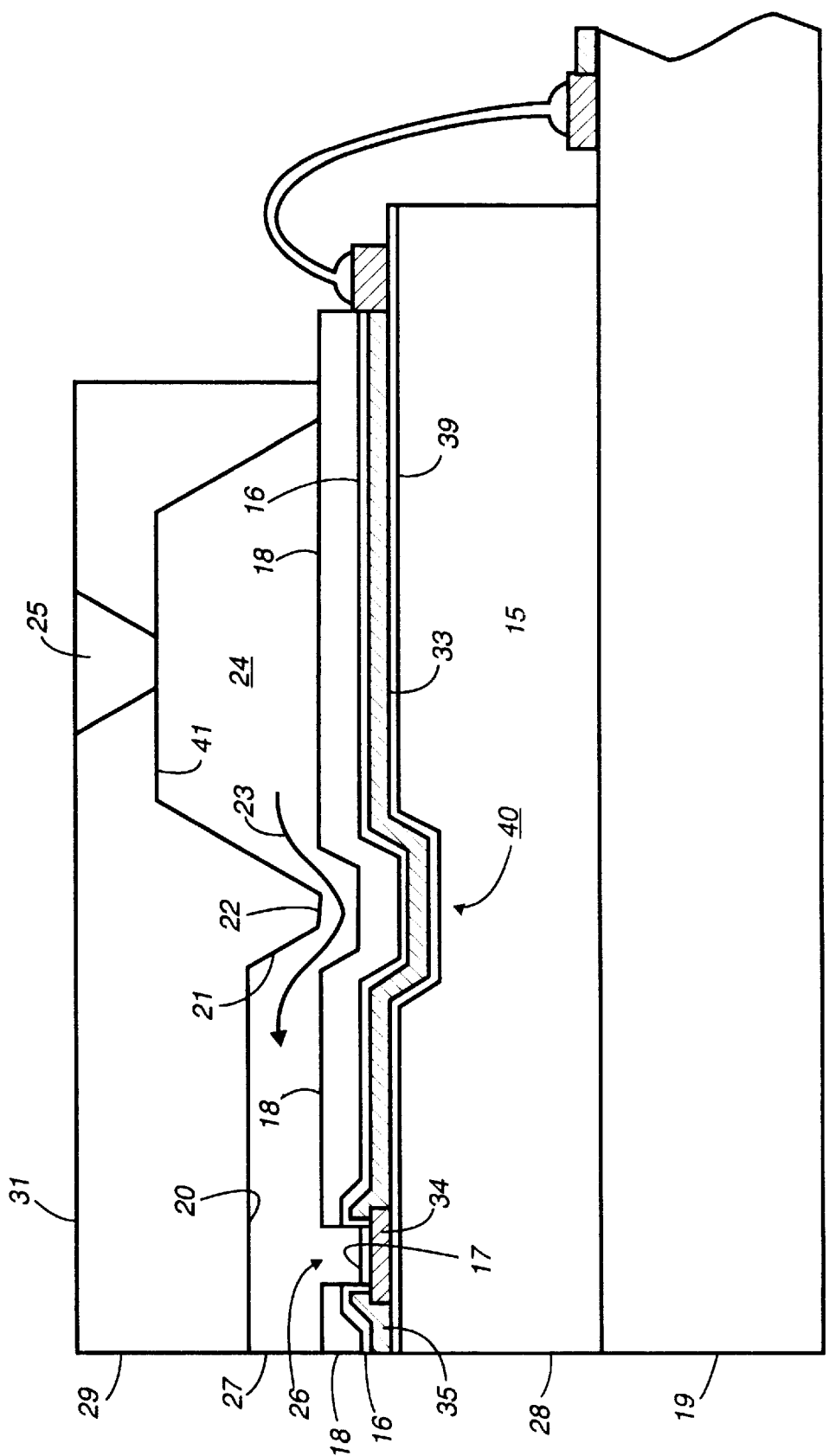
FIG. 3 is an enlarged cross-sectional view of an alternate embodiment of the printhead in FIG. 1 as viewed along the line 2—2 thereof.

FIG. 3 is a similar view to that of FIG. 2 with a shallow anisotropically etched groove 40 in the heater plate, which is silicon, prior to formation of the underglaze 39 and patterning of the heating elements 34, electrodes 33 and common return 35. This recess 40 permits the use of only the thick film insulative layer 18 and eliminates the need for the usual electrode passivating layer 16. Since the thick film layer 18 is impervious to water and relatively thick (typically from about 20 to about 40 microns, although the thickness can be outside this range), contamination introduced into the circuitry will be much less than with only the relatively thin passivation layer 16 well known in the art. The heater plate is a fairly hostile environment for integrated circuits. Commercial ink generally entails a low attention to purity. As a result, the active part of the heater plate will be at elevated temperature adjacent to a contaminated aqueous ink solution which undoubtedly abounds with mobile ions. In addition, it is generally desirable to run the heater plate at a voltage of from about 30 to about 50 volts, so that there will be a substantial field present. Thus, the thick film insulative layer 18 provides improved protection for the active devices and provides improved protection and a fluid path for the ink, resulting in longer operating lifetime for the heater plate.

When a plurality of lower substrates 28 are produced from a single silicon wafer, at a convenient point after the underglaze is deposited, at least two alignment markings (not shown) preferably are photolithographically produced at predetermined locations on the lower substrates 28 which make up the silicon wafer. These alignment markings are used for alignment of the plurality of upper substrates 31 containing the ink channels. The surface of the single sided wafer containing the plurality of sets of heating elements is bonded to the surface of the wafer containing the plurality of ink channel containing upper substrates subsequent to alignment.

As disclosed in U.S. Pat. No. 4,601,777 and U.S. Pat. No. 4,638,337, the disclosures of each of which are totally incorporated herein by reference, the channel plate is formed from a two side polished, (100) silicon wafer to produce a plurality of upper substrates 31 for the printhead. After the wafer is chemically cleaned, a pyrolytic CVD silicon nitride layer (not shown) is deposited on both sides. Using conventional photolithography, a via for fill hole 25 for each of the plurality of channel plates 31 and at least two vias for alignment openings (not shown) at predetermined locations are printed on one wafer side. The silicon nitride is plasma etched off of the patterned vias representing the fill holes and alignment openings. A potassium hydroxide (KOH) anisotropic etch can be used to etch the fill holes and alignment openings. In this case, the [111] planes of the (100) wafer typically make an angle of about 54.7 degrees with the surface of the wafer. The fill holes are small square surface patterns, generally of about 20 mils (500 microns) per side, although the dimensions can be above or below this value, and the alignment openings are from about 60 to about 80 mils (1.5 to 3 millimeters) square, although the dimensions can be outside this range. Thus, the alignment openings are etched entirely through the 20 mil (0.5 millimeter) thick wafer, while the fill holes are etched to a terminating apex at about halfway through to three-quarters through the wafer. The relatively small square fill hole is invariant to further size increase with continued etching so that the etching of the alignment openings and fill holes are not significantly time constrained.

Next, the opposite side of the wafer is photolithographically pattered, using the previously etched alignment holes as a reference to form the relatively large rectangular recesses 24 and sets of elongated, parallel channel recesses that will eventually become the ink manifolds and channels of the printheads. The surface 22 of the wafer containing the manifold and channel recesses are portions of the original wafer surface (covered by a silicon nitride layer) on which an adhesive, such as a thermosetting epoxy, will be applied later for bonding it to the substrate containing the plurality of sets of heating elements. The adhesive is applied in a manner such that it does not run or spread into the grooves or other recesses. The alignment markings can be used with, for example, a vacuum chuck mask aligner to align the channel wafer on the heating element and addressing electrode wafer. The two wafers are accurately mated and can be tacked together by partial curing of the adhesive. Alternatively, the heating element and channel wafers can be given precisely diced edges and then manually or automatically aligned in a precision jig. Alignment can also be performed with an infrared aligner-bonder, with an infrared microscope using infrared opaque markings on each wafer to be aligned, or the like. The two wafers can then be cured in an oven or laminator to bond them together permanently. The channel wafer can then be milled to produce individual upper substrates. A final dicing cut, which produces end face 29, opens one end of the elongated groove 20 producing nozzles 27. The other ends of the channel groove 20 remain closed by end 21. However, the alignment and bonding of the channel plate to the heater plate places the ends 21 of channels 20 directly over elongated recess 38 in the thick film insulative layer 18 as shown in FIG. 2 or directly above the recess 40 as shown in FIG. 3 enabling the flow of ink into the channels from the manifold as depicted by arrows 23. The plurality of individual printheads produced by the final dicing are bonded to the daughter board and the printhead electrode terminals are wire bonded to the daughter board electrodes.

In one embodiment, a heater wafer with a phosphosilicate glass layer is spin coated with a solution of one or more of the adhesion promoters of the present invention (0.5 weight percent in methanol) at 2,000 revolutions per minute for 30 seconds and air dried for between 10 and 20 minutes before spin coating the photoresist containing the photopatternable polymer onto the wafer at between 1,000 and 3,000 revolutions per minute for between 30 and 60 seconds. The photoresist solution is made by dissolving polyarylene ether ketone with 0.75 acryloyl groups and 0.75 chloromethyl groups per repeat unit and a weight average molecular weight of 25,000 in N-methylpyrrolidinone at 40 weight percent solids with Michler's ketone (1.2 parts ketone per every 10 parts of 40 weight percent solids polymer solution). In another embodiment, the adhesion promoter is added directly to the polymer film solution, and the resulting solution is spin coated as described above. The film is heated (soft baked) in an oven for between 10 and 15 minutes at 70° C. After cooling to 25° C. over 5 minutes, the layered structure is covered with a mask and exposed to 365 nanometer ultraviolet light, amounting to between 150 and 1500 millijoules per $cm^2$. The exposed wafer is then heated at 70° C. for 2 minutes post exposure bake, followed by cooling to 25° C. over 5 minutes. The ultraviolet light exposure and subsequent post exposure bake are believed to cause crosslinking of the adhesion promoter to the polymer network. The film is developed with 60:40 chloroform/cyclohexanone developer, washed with 90:10 hexanes/cyclohexanone, and then dried at 70° C. for 2 minutes. A second developer/wash cycle is carried out if necessary to obtain a wafer with clean features. The processed wafer is transferred to an oven at 25° C., and the oven temperature is raised from 25 to 90° C. at 2° C. per minute. The temperature is maintained at 90° C. for 2 hours, and then increased to 260° C. at 2° C. per minute. The oven temperature is maintained at 260° C. for 2 hours and then the oven is turned off and the temperature is allowed to cool gradually to 25° C. When thermal cure of the photoresist films is carried out under an inert atmosphere, such as nitrogen or one of the noble gases, such as argon, neon, krypton, xenon, or the like, there is markedly reduced oxidation of the developed film and improved thermal and hydrolytic stability of the resultant devices. Moreover, adhesion of developed photoresist film is improved to the underlying substrate. If a second layer is spin coated over the first layer, the heat cure of the first developed layer can be stopped between 80 and 260° C. before the second layer is spin coated onto the first layer. A second thicker layer is deposited by repeating the above procedure a second time. This process is intended to be a guide in that procedures can be outside the specified conditions depending on film thickness and photoresist molecular weight. Films at 30 microns have been developed with clean features at 600 dots per inch.

For best results with respect to well-resolved features and high aspect ratios, photoresist compositions for printheads of the present invention are free of particulates prior to coating onto substrates. In one preferred embodiment, the photoresist composition containing the photopatternable polymer is subjected to filtration through a 2 micron nylon filter cloth (available from Tetko). The photoresist solution is filtered through the cloth under yellow light or in the dark as a solution containing from about 30 to about 60 percent by weight solids using compressed air (up to about 60 psi) and a pressure filtration funnel. No dilution of the photoresist solution is required, and concentrations of an inhibitor (such as, for example, MEHQ) can be as low as, for example, 500 parts per million or less by weight without affecting shelf life. No build in molecular weight of the photopatternable polymer is observed during this filtration process. While not being limited to any particular theory, it is believed that in some instances, such as those when unsaturated ester groups are present on the photopolymerizable polymer, compressed air yields results superior to those obtainable with inert atmosphere because oxygen in the compressed air acts as an effective inhibitor for the free radical polymerization of unsaturated ester groups such as acrylates and methacrylates.

In a particularly preferred embodiment, the photopatternable polymer is admixed with an epoxy resin in relative amounts of from about 75 parts by weight photopatternable polymer and about 25 parts by weight epoxy resin to about 90 parts by weight photopatternable polymer and about 10 parts by weight epoxy resin. Examples of suitable epoxy resins include EPON 1001 F, available from Shell Chemical Co., Houston, Tex., believed to be of the formula

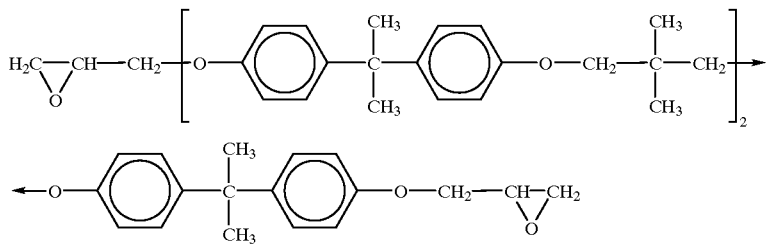

and the like, as well as mixtures thereof. Curing agents of the present invention as well as mixtures thereof can be used to cure the epoxy resin at typical relative amounts of about 10 weight percent curative per gram of epoxy resin solids. Process conditions for the epoxy resin blended with the photopatternable polymer are generally similar to those used to process the photoresist without epoxy resin. Preferably, the epoxy or epoxy blend is selected so that its curing conditions are different from the conditions employed to apply, image, develop, and cure the photopatternable polymer. Selective stepwise curing allows development of the photoresist film before curing the epoxy resin to prevent unwanted epoxy residues on the device. Incorporation of the epoxy resin into the photopatternable polymer material improves the adhesion of the photopatternable layer to the heater plate. Subsequent to imaging and during cure of the photopatternable polymer, the epoxy reacts with the heater layer to form strong chemical bonds with that layer, improving adhesive strength and solvent resistance of the interface.

The presence of the epoxy may also improve the hydrophilicity of the photopatternable polymer and thus may improve the wetting properties of the layer, thereby improving the refill characteristics of the printhead.

In one embodiment, the photopatternable polymer is of the general formula

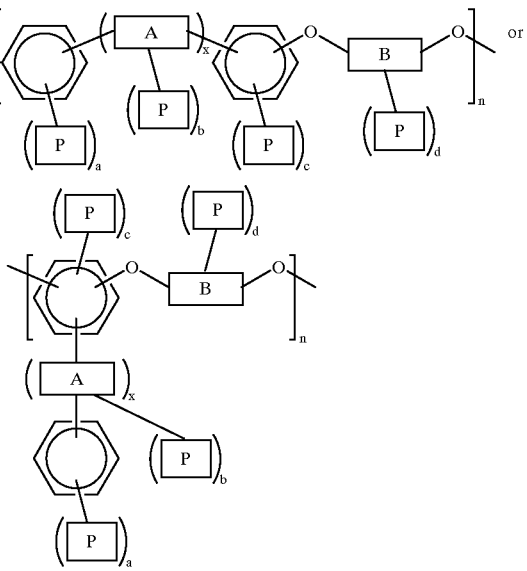

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

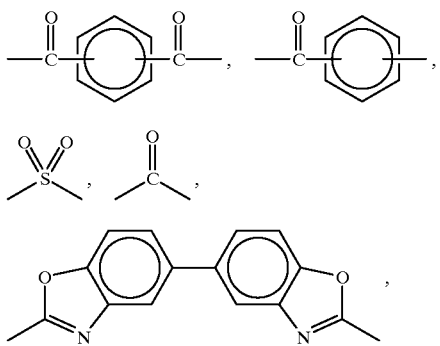

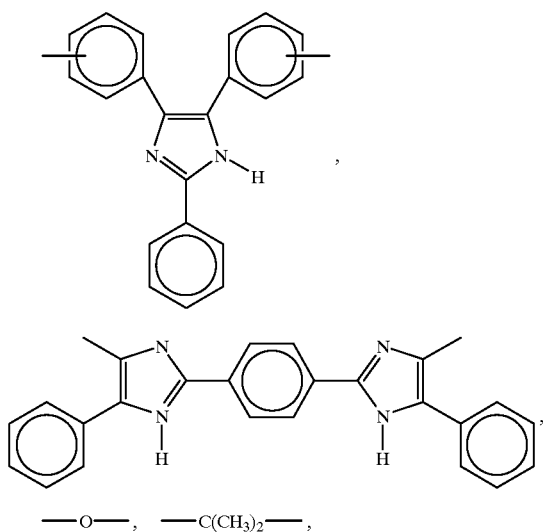
or mixtures thereof, B is
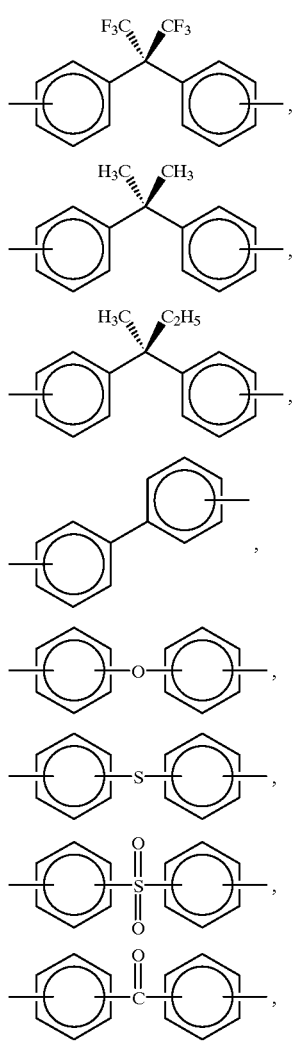
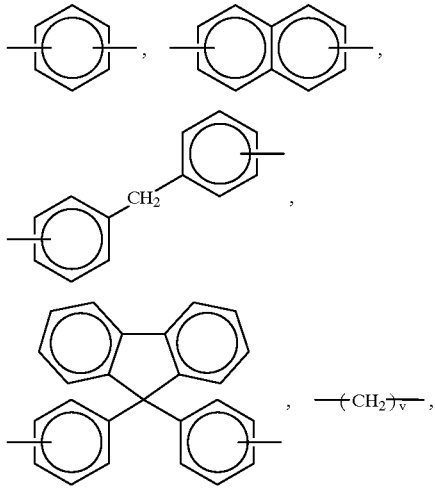
wherein v is an integer of from 1 to about 20, and preferably from 1 to about 10,
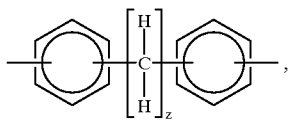
wherein z is an integer of from 2 to about 20, and preferably from 2 to about 10,
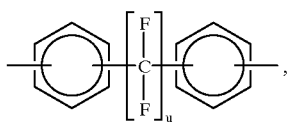
wherein u is an integer of from 1 to about 20, and preferably from 1 to about 10,
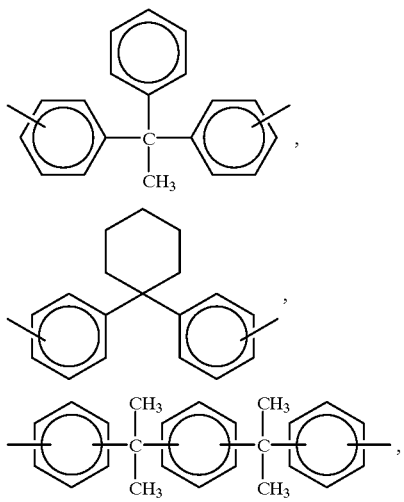

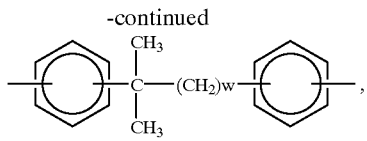

wherein w is an integer of from 1 to about 20, and preferably from 1 to about 10,

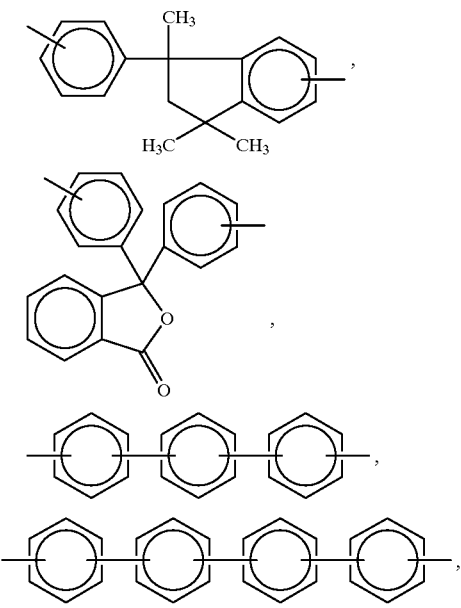

other similar bisphenol derivatives, or mixtures thereof, and n is an integer representing the number of repeating monomer units. The value of n is such that the weight average molecular weight of the material is from about 1,000 to about 100,000, preferably from about 1,000 to about 65,000, more preferably from about 1,000 to about 40,000, and even more preferably from about 3,000 to about 25,000, although the weight average molecular weight can be outside these ranges. Preferably, n is an integer of from about 2 to about 70, more preferably from about 5 to about 70, and even more preferably from about 8 to about 50, although the value of n can be outside these ranges. The phenyl groups and the A and/or B groups may also be substituted, although the presence of two or more substituents on the B group ortho to the oxygen groups can render substitution difficult. Substituents can be present on the polymer either prior to or subsequent to the placement of photosensitivity-imparting functional groups thereon. Substituents can also be placed on the polymer during the process of placement of photosensitivity-imparting functional groups thereon. Examples of suitable substituents include (but are not limited to) alkyl groups, including saturated, unsaturated, and cyclic alkyl groups, preferably with from 1 to about 6 carbon atoms, substituted alkyl groups, including saturated, unsaturated, and cyclic substituted alkyl groups, preferably with from 1 to about 6 carbon atoms, aryl groups, preferably with from 6 to about 24 carbon atoms, substituted aryl groups, preferably with from 6 to about 24 carbon atoms, arylalkyl groups, preferably with from 7 to about 30 carbon atoms, substituted arylalkyl groups, preferably with from 7 to about 30 carbon atoms, alkoxy groups, preferably with from 1 to about 6 carbon atoms, substituted alkoxy groups, preferably with from 1 to about 6 carbon atoms, aryloxy groups, preferably with from 6 to about 24 carbon atoms, substituted aryloxy groups, preferably with from 6 to about 24 carbon atoms, arylalkyloxy groups, preferably with from 7 to about 30 carbon atoms, substituted arylalkyloxy groups, preferably with from 7 to about 30 carbon atoms, hydroxy groups, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein two or more substituents can be joined together to form a ring, wherein the substituents on the substituted alkyl groups, substituted aryl groups, substituted arylalkyl groups, substituted alkoxy groups, substituted aryloxy groups, and substituted arylalkyloxy groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein two or more substituents can be joined together to form a ring. Processes for the preparation of these materials are known, and disclosed in, for example, P. M. Hergenrother, *J. Macromol. Sci. Rev. Macromol. Chem.*, C19 (1), 1–34 (1980); P. M. Hergenrother, B. J. Jensen, and S. J. Havens, *Polymer*, 29, 358 (1988); B. J. Jensen and P. M. Hergenrother, "High Performance Polymers," Vol. 1, No. 1) page 31 (1989), "Effect of Molecular Weight on Poly (arylene ether ketone) Properties"; V. Percec and B. C. Auman, *Makromol. Chem.* 185, 2319 (1984); "High Molecular Weight Polymers by Nickel Coupling of Aryl Polychlondes," I. Colon, G. T. Kwaiatkowski, *J. of Polymer Science, Part A, Polymer Chemistry*, 28, 367 (1990); M. Ueda and T. Ito, *Polymer J.*, 23 (4), 297 (1991); "Ethynyl-Terminated Polyarylates: Synthesis and Characterization," S. J. Havens and P. M. Hergenrother, *J. of Polymer Science: Polymer Chemistry Edition*, 22, 3011 (1984); "Ethynyl-Terminated Polysulfones: Synthesis and Characterization," P. M. Hergenrother, *J. of Polymer Science: Polymer Chemistry Edition*, 20, 3131 (1982); K. E. Dukes, M. D. Forbes, A. S. Jeevarajan, A. M. Belu, J. M. DeDimone, R. W. Linton, and V. V. Sheares, *Macromolecules*, 29, 3081 (1996); G. Hougham, G. Tesoro, and J. Shaw, *Polym. Mater. Sci. Eng.*, 61, 369 (1989); V. Percec and B. C. Auman, *Makromol. Chem*, 185, 617 (1984); "Synthesis and characterization of New Fluorescent Poly(arylene ethers)," S. Matsuo, N. Yakoh, S. Chino, M. Mitani, and S. Tagami, *Journal of Polymer Science: Part A: Polymer Chemistry*, 32, 1071 (1994); "Synthesis of a Novel Naphthalene-Based Poly (arylene ether ketone) with High Solubility and Thermal Stability," Mami Ohno, Toshikazu Takata, and Takeshi Endo, *Macromolecules*, 27, 3447 (1994); "Synthesis and Characterization of New Aromatic Polyfether ketones)," F. W. Mercer, M. T. Mckenzie, G. Merlino, and M. M. Fone, *J. of Applied Polymer Science*, 56, 1397 (1995); H. C. Zhang, T. L. Chen, Y. G. Yuan, Chinese Patent CN 85108751 (1991); "Static and laser light scattering study of novel thermoplastics. 1. Phenolphthalein poly(aryl ether ketone)," C. Wu, S. Bo, M. Siddiq, G. Yang and T. Chen, *Macromolecules*, 29, 2989 (1996); "Synthesis of t-Butyl- Substituted Poly(ether ketone) by Nickel-Catalyzed Coupling Polymerization of Aromatic Dichloride", M. Ueda, Y. Seino, Y. Haneda, M. Yoneda, and J.-I. Sugiyama, *Journal of Polymer Science: Part A: Polymer Chemistry*, 32, 675 (1994); "Reaction Mechanisms: Comb-like Polymers and Graft Copolymers from Macromers 2. Synthesis, Characterzation and Homopolymerization of a Styrene Macromer of Poly(2,6-dimethyl-1,4-phenylene Oxide)," V. Percec, P. L. Rinaldi, and B. C. Auman, *Polymer Bulletin*, 10, 397 (1983); *Handbook of Polymer Synthesis Part A*, Hans R. Kricheldorf, ed., Marcel Dekker, Inc., New York-Basel-Hong Kong (1992); and "Introduction of Carboxyl Groups into Crosslinked Polystyrene," C. R. Harrison, P. Hodge, J. Kemp, and G. M. Perry, *Die Makromolekulare Chemie*, 176, 267 (1975), the disclosures of each of which are totally incorporated herein by reference. Further background on high performance polymers is disclosed in, for example, U.S. Pat. No. 2,822,351; U.S. Pat. No. 3,065,205; British Patent 1,060,546; British Patent 971,227; British Patent 1,078,234; U.S. Pat. No. 4,175,175; N. Yoda and H. Hiramoto, *J. Macromol. Sci.-Chem.*, A21(13 & 14) pp. 1641 (1984) (Toray Industries, Inc., Otsu, Japan; B. Sillion and L. Verdet, "Polyimides and other High-Temperature polymers", edited by M. J. M. Abadie and B. Sillion, Elsevier Science Publishers B.V. (Amsterdam 1991); "Polyimides with Alicyclic Diamines. II. Hydrogen Abstraction and Photo crosslinking Reactions of Benzophenone Type Polyimides," Q. Jin, T. Yamashita, and K. Horie, *J. of Polymer Science: Part A: Polymer Chemistry*, 32, 503 (1994); Probimide™ 300, product bulletin, Ciba-Geigy Microelectronics Chemicals, "Photosensitive Polyimide System;" *High Performance Polymers and Composites*, J. I. Kroschwitz (ed.), John Wiley & Sons (New York 1991); and T. E. Atwood, D. A. Barr, T. A. King, B. Newton, and B. J. Rose, *Polymer*, 29, 358 (1988), the disclosures of each of which are totally incorporated herein by reference. Further information on radiation curing is disclosed in, for example, *Radiation Curing: Science and Technology*, S. Peter Pappas, ed., Plenum Press (New York 1992), the disclosure of which is totally incorporated herein by reference. Polymers of these formulae, the preparation thereof, and the use thereof as photopatternable polymers in layer 18 of thermal ink jet printheads are disclosed in, for example, U.S. Pat. No. 5,739,254, copending application U.S. Ser. No. 08/705,375, filed Aug. 29, 1996, copending application U.S. Ser. No. 08/705,365, filed Aug. 29, 1996, copending application U.S. Ser. No. 08/705,488, filed Aug. 29, 1996, copending application U.S. Ser. No. 08/697,761, filed Aug. 29, 1996, copending application U.S. Ser. No. 08/705,479, filed Aug. 29, 1996, copending application U.S. Ser. No. 08/705,376, filed Aug. 29, 1996, copending application U.S. Ser. No. 08/705,372, filed Aug. 29, 1996, copending application U.S. Ser. No. 08/705,490, filed Aug. 29, 1996, copending application U.S. Ser. No. 08/697,760, filed Aug. 29, 1996, copending application U.S. Ser. No. 08/920,240, filed Aug. 28, 1997, European Patent Publication 0,826,700, European Patent Publication 0,827,027, European Patent Publication 0,827,028, European Patent Publication 0,827,029, European Patent Publication 0,827,030, European Patent Publication 0,827,026, European Patent Publication 0,827,031, European Patent Publication 0,827,033, and European Patent Publication 0,827,032, the disclosures of each of which are totally incorporated herein by reference.

Examples of suitable "P" groups include (but are not limited to) unsaturated ester groups, such as acryloyl groups, methacryloyl groups, glycidyl methacryloyl groups, cinnamoyl groups, crotonoyl groups, ethacryloyl groups, oleoyl groups, linoleoyl groups, maleoyl groups, fumaroyl groups, itaconoyl groups, citraconoyl groups, phenylmaleoyl groups, esters of 3-hexene-1,6-dicarboxylic acid, and the like, with an example illustrated below for acryloyl groups,

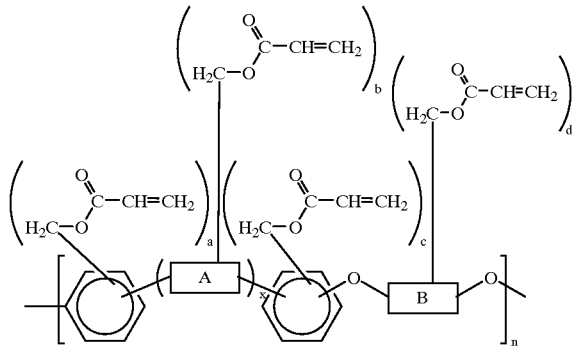

wherein a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units, alkylcarboxymethylene groups, of the above formula wherein the

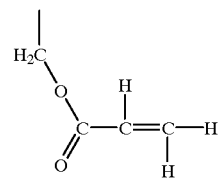

groups shown above are replaced with, for example,

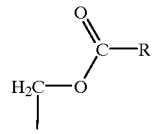

groups, wherein R is an alkyl group (including saturated, unsaturated, and cyclic alkyl groups), preferably with from 1 to about 30 carbon atoms, more preferably with from 1 to about 6 carbon atoms, a substituted alkyl group, an aryl group, preferably with from 6 to about 30 carbon atoms, more preferably with from 1 to about 2 carbon atoms, a substituted aryl group, an arylalkyl group, preferably with from 7 to about 35 carbon atoms, more preferably with from 7 to about 15 carbon atoms, or a substituted arylalkyl group, wherein the substituents on the substituted alkyl, aryl, and arylalkyl groups can be (but are not limited to) alkoxy groups, preferably with from 1 to about 6 carbon atoms, aryloxy groups, preferably with from 6 to about 24 carbon atoms, arylalkyloxy groups, preferably with from 7 to about 30 carbon atoms, hydroxy groups, amine groups, imine groups, ammonium groups, pyridine groups, pyridinium groups, ether groups, ester groups, amide groups, carbonyl groups, thiocarbonyl groups, sulfate groups, sulfonate groups, sulfide groups, sulfoxide groups, phosphine groups, phosphonium groups, phosphate groups, mercapto groups, nitroso groups, sulfone groups, acyl groups, acid anhydride groups, azide groups, and the like, wherein two or more substituents can be joined together to form a ring, allyl groups, vinyl groups, and unsaturated ether groups, of the above formula wherein the groups shown above are replaced with, for example,

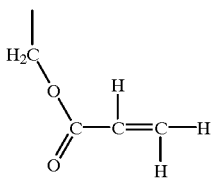

groups shown above are replaced with, for example,

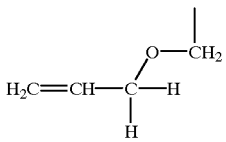

groups, unsaturated ammonium groups and unsaturated phosphonium groups, of the above formula wherein the

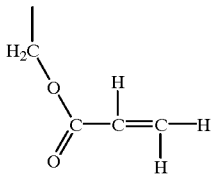

groups shown above are replaced with, for example,

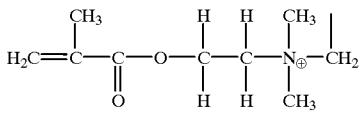

groups or similar phosphonium groups, and the like. Under certain conditions, such as imaging with electron beam, deep ultraviolet, or x-ray radiation, polymers having haloalkyl groups (with halomethyl groups being preferred), of the general formula

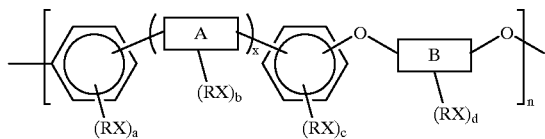

wherein n is an integer of 1, 2, 3, 4, or 5, R is an alkyl group, including both saturated, unsaturated, linear, branched, and cyclic alkyl groups, preferably with from 1 to about 11 carbon atoms, more preferably with from 1 to about 5 carbon atoms, even more preferably with from 1 to about 3 carbon atoms, and most preferably with 1 carbon atom, or a substituted alkyl group, an arylalkyl group, preferably with from 7 to about 29 carbon atoms, more preferably with from 7 to about 17 carbon atoms, even more preferably with from 7 to about 13 carbon atoms, and most preferably with from 7 to about 9 carbon atoms, or a substituted arylalkyl group, and X is a halogen atom, such as fluorine, chlorine, bromine, or iodine, a, b, c, and d are each integers of 0, 1, 2, 3, or 4, provided that at least one of a, b, c, and d is equal to or greater than 1 in at least some of the monomer repeat units of the polymer, and n is an integer representing the number of repeating monomer units, are also photoactive.

The degree of substitution of the polymer with the photosensitivity-imparting substituents (i.e., the average number of photosensitivity-imparting substituents per monomer repeat unit) preferably is from about 0.25 to about 1.2, and more preferably from about 0.65 to about 0.8, although the degree of substitution can be outside these ranges. This degree of substitution generally corresponds to from about 0.5 to about 1.3 milliequivalents of photosensitivity-imparting substituent per gram of resin.

In another embodiment, the polymer of the above formula is substituted with two different functional groups, one of which imparts photosensitivity to the polymer and one of which imparts water solubility or water dispersability to the polymer. Examples of reactants which can be reacted with the polymer to substitute the polymer with suitable water solubility enhancing groups or water dispersability enhancing groups include tertiary amines, of the general formula

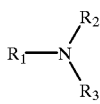

which add to the polymer quaternary ammonium groups, of the general formula

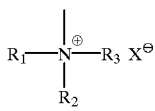

wherein $R_1$, $R^2$, and $R_3$ each, independently of the others, can be (but are not limited to) alkyl groups, typically with from 1 to about 30 carbon atoms, substituted alkyl groups, aryl groups, typically with from 6 to about 18 carbon atoms, substituted aryl groups, arylalkyl groups, typically with from 7 to about 19 carbon atoms, and substituted arylalkyl groups, and X represents a halogen atom, such as fluorine, chlorine, bromine, or iodine; tertiary phosphines, of the general formula

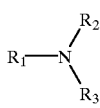

which add to the polymer quaternary phosphonium groups of the general formula

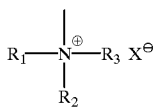

wherein $R_1$, $R_2$, and $R_3$ each, independently of the others, can be (but are not limited to) alkyl groups, typically with from 1 to about 30 carbon atoms, substituted alkyl groups, aryl groups, typically with from 6 to about 18 carbon atoms, substituted aryl groups, arylalkyl groups, typically with from 7 to about 19 carbon atoms, and substituted arylalkyl groups, and X represents a halogen atom, such as fluorine, chlorine, bromine, or iodine; alkyl thio ethers, of the general formula

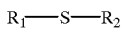

which add to the polymer sulfonium groups of the general formula

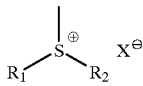

wherein $R_1$ and $R_2$ each, independently of the other, can be (but are not limited to) alkyl groups, typically with from 1 to about 6 carbon atoms and preferably with 1 carbon atom, and substituted alkyl groups, and X represents a halogen atom, such as fluorine, chlorine, bromine, or iodine; wherein the substituents on the substituted alkyl, aryl, and arylalkyl groups can be (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein two or more substituents can be joined together to form a ring. The degree of substitution (i.e., the average number of water solubility imparting groups or water dispersability imparting groups per monomer repeat unit) typically is from about 0.25 to about 4.0, and preferably from about 0.5 to about 2, although the degree of substitution can be outside these ranges. Optimum amounts of substitution are from about 0.8 to about 2 milliequivalents of water solubility imparting group or water dispersability imparting group per gram of resin, and preferably from about 1 to about 1.5 milliequivalents of water solubility imparting group or water dispersability imparting group per gram of resin.

In one specific embodiment, the photopatternable polymer has both halomethyl substituents, such as chloromethyl groups, bromomethyl groups, or the like, and other photosensitivity-imparting groups, such as unsaturated ester groups, including acryloyl groups, methacryloyl groups, or the like, and is illustrated below for the embodiment with chloromethyl groups and acryloyl groups:

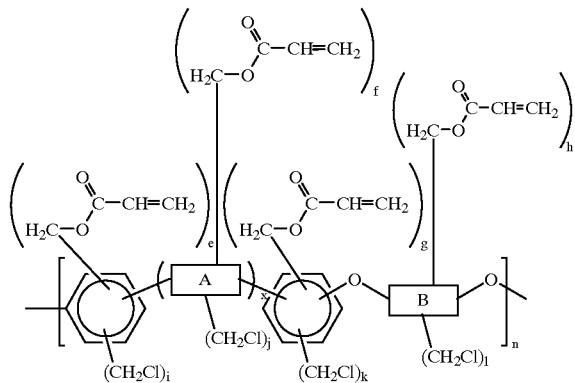

wherein e, f, g, h, i, j, k, and m are each integers of 0, 1, 2, 3, or 4, provided that the sum of i+e is no greater than 4, the sum of j+f is no greater than 4, the sum of k+g is no greater than 4, and the sum of m+h is no greater than 4, and provided that at least one of e, f, g, and h is equal to at least 1 in at least some of the monomer repeat units of the polymer, and n is an integer representing the number of repeating monomer units. In this instance, the polymer typically has a degree of substitution of from about 0.25 to about 2.25, preferably from about 0.75 to about 2, and more preferably from about 0.75 to about 1 halomethyl group per monomer repeat unit, and from about 0.25 to about 1.5, preferably from about 0.5 to about 0.8, and more preferably about 0.75 of the other photosensitivity-imparting groups per monomer repeat unit, although the relative amounts can be outside these ranges.

Blends of polymers can also be employed, provided that at least one of the polymers contains photosensitivity-imparting substituents. Blends of polymers preferably contain at least 25 percent by weight of the polymer having photosensitivity-imparting substituents.

The adhesion promoters of the present invention are selected from silanes, titanates, or zirconates having (a) alkoxy, aryloxy, or arylalkyloxy functional groups and (b) functional groups including at least one photosensitive aliphatic >C=C< linkage. Examples of photosensitive aliphatic >C=C< linkage containing groups include unsaturated esters, such as acrylates, methacrylates, glycidyl acrylates and methacrylates, and the like, allyl groups, vinyl groups, and the like. In one embodiment, the silanes, titanates, and zirconates are of the general formula

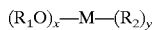

or

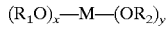

wherein M is Si, Ti, or Zr, x and y are each integers of 1, 2, or 3, wherein the sum of x+y is from 4 to 6, $R_1$ is an alkyl group, including long chain, branched, cyclic, saturated, unsaturated, and substituted alkyl groups, typically with from 1 to about 20 carbon atoms, and preferably with from 1 to about 15 carbon atoms, although the number can be outside of these ranges, an aryl group, including substituted aryl groups, typically with from 6 to about 24 carbon atoms, and preferably with from 6 to about 12 carbon atoms, although the number can be outside of these ranges, or an arylalkyl group, including substituted arylalkyl groups, typically with from 7 to about 28 carbon atoms, and preferably with from 7 to about 15 carbon atoms, although the number can be outside of these ranges, and $R_2$ is an unsaturated alkyl group, including long chain, branched, cyclic, and substituted unsaturated alkyl groups, typically with from 2 to about 20 carbon atoms, and preferably with from 2 to about 15 carbon atoms, although the number can be outside of these ranges, or an unsaturated arylalkyl group, including substituted unsaturated arylalkyl groups, typically with from 8 to about 28 carbon atoms, and preferably with from 8 to about 15 carbon atoms, although the number can be outside of these ranges, wherein examples of substituents which can be present on the substituted alkyl, aryl, and arylalkyl groups include (but are not limited to) hydroxy groups, amine groups, imine groups, ammonium groups, pyridine groups, pyridinium groups, ether groups, aldehyde groups, ketone groups, ester groups, amide groups, carboxylic acid groups, carbonyl groups, thiocarbonyl groups, sulfate groups, sulfonate groups, sulfide groups, sulfoxide groups, phosphine groups, phosphonium groups, phosphate groups, cyano groups, nitrile groups, mercapto groups, nitroso groups, halogen atoms, nitro groups, sulfone groups, acyl groups, acid anhydride groups, azide groups, mixtures thereof, and the like, wherein two or more substituents can be joined together to form a ring. Generally, the OR$_1$ group reacts with the article of metal, plasma nitride, silicon, or glass by, for example, hydrolysis or solvolysis to form an organofunctional monolayer, and the R$_2$ group reacts with the article comprising the photopatternable polymer. Further information on adhesion promoters is disclosed in, for example, "Factors Affecting Adhesion of Uithographic Materials," K. L. Mittal, *Solid State Technology*, p. 89 (May 1979); "Hydrolysis, Adsorption, and Dynamics of Silane Coupling Agents on Silica Surfaces;" F. D. Blum et al., *J. Adhesion Sci. Technol.*, Vol. 5. No. 6, pp. 479–296 (1991); and "The Theory of Organo Titanate Coupling Agents," S. J. Monte et al., *SPE ANTEC*, p. 27, Apr. 26–29, 1976, Atlantic City, N.J.; the disclosures of each of which are totally incorporated herein by reference.

Specific examples of suitable adhesion promoters for the present invention include NZ39, available from Kenrich, Inc., Bayonne, N.J., of the formula

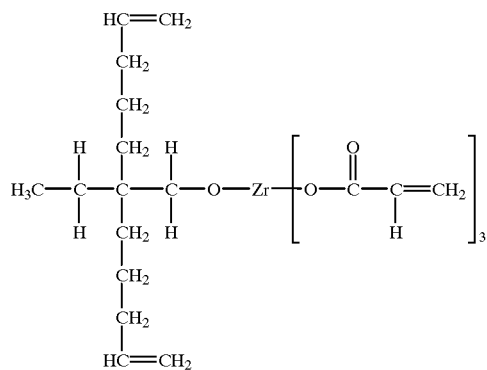

NZ33, available from Kenrich, Inc., Bayonne, N.J., of the formula

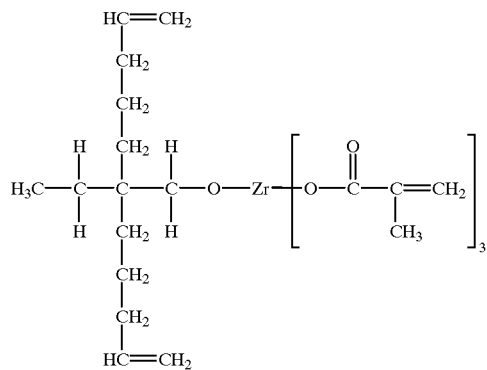

KR 39DS, available from Kenrich, Inc., Bayonne, N.J., of the formula

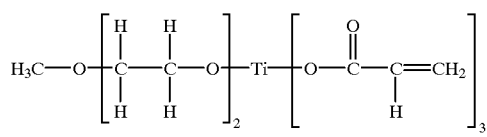

LICA97, available from Kenrich, Inc., Bayonne, N.J., of the formula

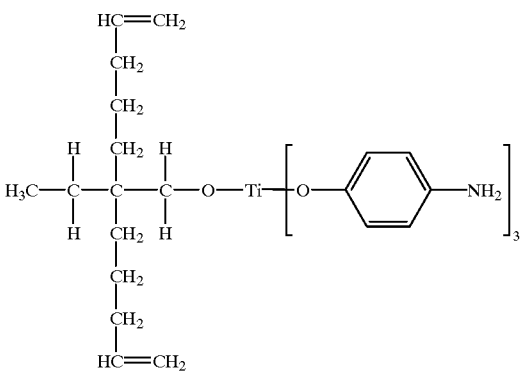

and Z6030, available from Dow Chemical Co., Midland, Mich., of the formula

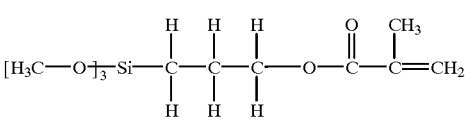

The adhesion promoter typically is admixed with a solvent and coated onto the article for which bonding is desired. Examples of suitable solvents include water (particularly acidified water, acidified with an acid such as glacial acetic acid to a pH of from about 3.5 to about 4.5), methanol, isopropanol, 2-methoxyethanol, glycol based solvents such as butyl carbitol, 2-methoxyethyl ether, cellosolve, cellosolve acetate, methyl cellosolve, ethyl cellosolve, methyl ethyl ketone, xylene, N-methyl pyrrolidone, and the like, as well as mixtures thereof. Silane adhesion promoters are typically applied from aqueous solvents, since hydrolysis of the alkoxy, aryloxy, or arylalkyloxy groups to reactive groups on the surface of the coated article is desired. This result is best effected by reaction with water prior to spin casting, although trialkoxy containing silanes or partially hydrolyzed silanes may be directly applied to the article to be coated. The adhesion promoter is present in the solvent in any desired or effective amount, typically from about 0.005 to about 10 percent by weight, and preferably from about 0.1 to about 1 percent by weight of the solution, although the amount can be outside of this range. Coating of the article or articles to be bonded can be by any desired or suitable method, such as spin casting or the like. After coating the article to be bonded, heat treatment of the silane adhesion promoter is typically carried out to effect the hydrolysis reaction of the silanol groups with surface hydroxyls. Typically, the zirconate and titanate adhesion promoters are already in the surface reactive form and can be applied directly from solvent. Heat activation is also not necessary with zirconate and titanate adhesion promoters, and in situations wherein the adhesion promoter has many photoactive groups, heat treatment can result in premature crosslinking within the adhesion promoter layer prior to contacting the article to be bonded. When spin casting methods are used, the spin rate and solution concentrations are adjusted to produce an adhesion promoter layer of the desired thickness. Typical adhesion promoter layer thicknesses range from as low as a monolayer (less than about 10 to about 100 nanometers) to many multilayers (about 0.5 to about 5.0 microns). Spin rates typically range from about 300 to about 3,000 rpm, and preferably from about 1,500 to about 2,000 rpm, although the rate can be outside of these ranges. After applying the silane adhesion promoter layer, the adhesion promoter typically is heat activated for from about 5 to about 15 minutes, typically at temperatures of from about 50 to about 100° C., to effect the bonding between the silane and the article to be bonded.

In another embodiment of the present invention, the adhesion promoter is added directly to a solution containing the polymer with photosensitivity-imparting substituents. In this instance, the optimum concentration of adhesion promoter in the solution can be determined by the mole fraction of the photoactive groups. Typically the adhesion promoter concentration in the polymer solution is in from about 1 to about 5 mole excess of the photoactive groups on the backbone of the photopatternable polymer monomers.

Specific embodiments of the invention will now be described in detail. These examples are intended to be illustrative, and the invention is not limited to the materials, conditions, or process parameters set forth in these embodiments. All parts and percentages are by weight unless otherwise indicated.

EXAMPLE I

Adhesion promoter solutions were prepared by admixing LICA97 adhesion promoter (obtained from Kenrich; commercially obtained stock solution contained 55 percent by weight of the adhesion promoter in a solvent) and 2-methoxyethanol to form solutions containing 0.05 percent by weight of the stock solution, 0.20 percent by weight of the stock solution, and 0.33 percent by weight of the stock solution.

Phosphosilicate glass wafers were first washed to remove any phosphate salts that may have leached out of the glass and segregated on the surface. Thereafter, the adhesion promoter solution thus prepared was spin coated onto the wafer at 2,000 rpm for 30 seconds, followed by air drying for 10 minutes. A solution was then prepared containing N-methyl pyrrolidone and a polymer of the formula

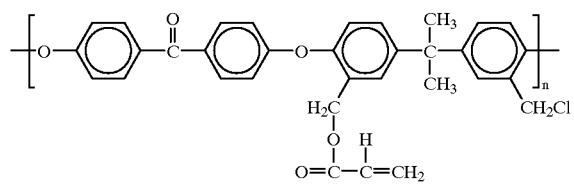

wherein the polymer had about 1.25 chloromethyl groups per repeat monomer unit and about 0.75 acryloyl group per repeat monomer unit and had a weight average molecular weight of about 43,700, with the polymer present in the solution in an amount of about 20 percent by weight. The polymer solution also contained a methyl ether of hydroquinone (MEHQ) inhibitor in an amount of about 500 parts per million. A small amount of a 0.2 weight percent solution of an initiator (Michler's ketone, 4,4'-bis-dimethylaminobenzophenone) was added just prior to spin casting. The polymer solution spin cast onto the adhesion promoter at 500 rpm for 30 seconds, followed by a pre-exposure bake in an oven at 80° C. for 15 minutes to drive off the N-methyl pyrrolidone. Thereafter, the wafer was flood exposed to ultraviolet light for 64 seconds using a Canon mask aligner. Post-exposure bake was in an oven which was heated to 120° C. at a rate of 2° C. per minute, maintained at that temperature for 2 hours, further heated to 250° C. at 2° C. per minute, and maintained at 250° C. for 2 hours. The resulting wafer had a layer of the polymer about 4 microns thick.

The wafers were diced into 3 millimeter by 5 millimeter samples, and polymer film adhesion was qualitatively measured using a tape test. The samples were first tested for initial adhesion retention before soaking in various liquids. After soaking for a given period of time, the sample was removed from the liquid, rinsed with water, and blow dried. The samples were then taped to an aluminum block using double-sided adhesive tape, with two pieces applied in the shape of a cross over each sample. The tape was then swiftly pulled off the sample and the sample and tape were inspected for any signs of polymer film peeling. The test was terminated when 50 percent or more of the polymer film had delaminated from the phosphosilicate glass substrate.

Samples were soaked at 25° C. in aqueous solutions of imidazole (20 percent by weight imidazole), urea (20 percent by weight urea), and N,N'-bis(3-aminopropyl)-1,2-ethylenediamine (N-BAPED) (5 percent by weight N-BAPED). The time to 50 percent or more delamination for samples coated with the adhesion promoter from solutions containing the three different concentrations was as follows:

|  | 0.05% | 0.20% | 0.33% |
|---|---|---|---|
| imidazole | 15–16 weeks | 2–3 days | 4 days |
| urea | 14–15 weeks | 5–23 hours | <16 hours |
| N-BAPED | 2–3 weeks | 1.5–3 hours | <16 hours |

The sample made with the 0.05% adhesion promoter solution was also soak tested at 40° C. The time to 50 percent or more delamination for this sample was 9.5 to 13.5 days in imidazole, 7.5 to 9 days in urea, and 3.5 to 5 days in N-BAPED.

EXAMPLE II

Adhesion promoter solutions were prepared by admixing NZ39 adhesion promoter (obtained from Kenrich; commercially obtained product contained 100 percent by weight of the adhesion promoter) and isopropanol to form solutions containing 0.43 percent by weight of the adhesion promoter, 0.59 percent by weight of the adhesion promoter, 1.02 percent by weight of the adhesion promoter, and 1.42 percent by weight of the adhesion promoter.

The adhesion promoter solutions were coated onto wafers by the method described in Example I, followed by coating the polymer containing photosensitivity-imparting substituents onto the adhesion promoter and soak testing by the methods described in Example I. The time to 50 percent or more delamination for samples coated with the adhesion promoter from solutions containing the four different concentrations was as follows:

|           | 0.43%       | 0.59%       | 1.02%       | 1.42%       |
|-----------|-------------|-------------|-------------|-------------|
| imidazole | <1 second*  | <1 second*  | 15–17 weeks | >7 weeks**  |
| urea      | <1 second*  | <1 second*  | 15–17 weeks | 5–6 weeks   |
| N-BAPED   | <1 second*  | <1 second*  | 4–6 days    | 3–5 days    |

*failed prior to soak
**test terminated after 7 weeks without having reached failure The samples made with the 1.02% adhesion promoter solution and the 1.42% adhesion promoter solution were also soak tested at 40° C. The time to 50 percent or more delamination for these samples was as follows:

|           | 1.02%       | 1.42%       |
|-----------|-------------|-------------|
| imidazole | 13–14 days  | 8–10 days   |
| urea      | 2–4 days    | 2–4 days    |
| N-BAPED   | 3.5–5 days  | 2.5–4.5 days|

EXAMPLE III

Adhesion promoter solutions were prepared by admixing KR 39DS adhesion promoter (obtained from Kendch; commercially obtained product contained 100 percent by weight of the adhesion promoter) and a solvent to form a solution containing 0.21 percent by weight of the adhesion promoter in butyl carbitol and a solution containing 1.15 percent by weight of the adhesion promoter in ethyl cellosolve.

The adhesion promoter solutions were coated onto wafers by the method described in Example I, followed by coating the polymer containing photosensitivity-imparting substituents onto the adhesion promoter and soak testing by the methods described in Example I. The time to 50 percent or more delamination for samples coated with the adhesion promoter from solutions containing the two different concentrations was as follows:

|           | 0.21%.      | 1.15%       |
|-----------|-------------|-------------|
| imidazole | <1 second*  | >6 weeks**  |
| urea      | <1 second*  | >6 weeks**  |
| N-BAPED   | <1 second*  | 4–6 days    |

*failed prior to soak
**test terminated after 6 weeks without having reached failure The sample made with the 1.15% adhesion promoter solution was also soak tested at 40° C. The time to 50 percent or more delamination for this sample was 12 to 14 days in imidazole, 10 to 13 days in urea, and 2 to 16 hours in N-BAPED.

EXAMPLE IV

Adhesion promoter solutions were prepared by admixing NZ33 adhesion promoter (obtained from Kenrich; commercially obtained stock solution contained 47 percent by weight of the adhesion promoter in a solvent) and xylene to form solutions containing 1.15 percent by weight of the stock solution and 1.40 percent by weight of the stock solution.

The adhesion promoter solutions were coated onto wafers by the method described in Example I, followed by coating the polymer containing photosensitivity-imparting substituents onto the adhesion promoter and soak testing by the methods described in Example I. In each instance, the samples failed prior to soak. It is believed that because the commercial stock solution contained only 47 percent by weight of the adhesion promoter, coating solutions of this adhesion promoter should contain at least about 2 percent by weight of the stock solution to achieve good results.

EXAMPLE V

Adhesion promoter solutions were prepared by admixing Z6030 adhesion promoter (obtained from Dow Chemical; commercially obtained stock solution contained 99 percent by weight of the adhesion promoter) and acidified water (acidified by adding glacial acetic acid to distilled water until the pH was from about 3.5 to about 4.5) to form solutions containing 0.30 percent by weight of the stock solution and 1.00 percent by weight of the stock solution.

The adhesion promoter solutions were coated onto wafers by the method described in Example I, followed by coating the polymer containing photosensitivity-imparting substituents onto the adhesion promoter and soak testing by the methods described in Example I, with the exception that subsequent to spin coating the adhesion promoter onto the wafer, the wafer was heated in an oven at 80° C. for 10 minutes (instead of being air dried for 10 minutes) to effect the alkoxy/silanol condensation reaction. The time to 50 percent or more delamination for samples coated with the adhesion promoter from solutions containing the two different concentrations was as follows:

|           | 0.30%       | 1.00%       |
|-----------|-------------|-------------|
| imidazole | 21–23 weeks | 2–3 days    |
| urea      | >29 weeks*  | 23 days     |
| N-BAPED   | >29 weeks*  | 1–3 days    |

*test terminated after 29 weeks without having reached failure

The sample made with the 0.30% adhesion promoter solution was also soak tested at 40° C. The time to 50 percent or more delamination for this sample was 7 to 10 days in imidazole, 16 to 22 days in urea, and 10 to 15 days in N-BAPED.

COMPARATIVE EXAMPLE A

A wafer was coated directly with a polymer containing photosensitivity-imparting groups by the method described in Example I, with no adhesion promoter being used. The resulting wafers were cut into samples and soak tested by the method described in Example I. The time to 50 percent or more delamination for the samples was 1 to 2 hours in imidazole, 1 to 1.5 hours in urea, and 15 to 17 minutes in N-BAPED.

COMPARATIVE EXAMPLE B

An adhesion promoter solution was prepared by admixing 5 drops of Z6020 adhesion promoter (of the formula

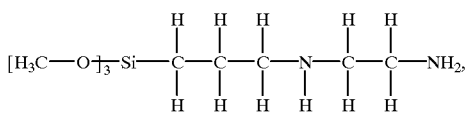

obtained from Dow Chemical; commercially obtained product contained 100 percent by weight of the adhesion promoter), 1 drop of water, and 100 milliliters of methanol.

The adhesion promoter solutions were coated onto wafers by the method described in Example V, followed by coating the polymer containing photosensitivity-imparting substituents onto the adhesion promoter and soak testing by the methods described in Example I. The time to 50 percent or more delamination for the samples was 1 to 3 hours in imidazole, 17 to 36 minutes in urea, and 18 to 37 minutes in N-BAPED.

POLYMER SYNTHESIS EXAMPLE I

A polyarylene ether ketone of the formula

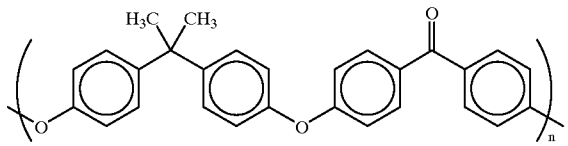

wherein n is between about 6 and about 30 (hereinafter referred to as poly(4-CPK-BPA)) was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 50 grams), bis-phenol A (Aldrich 23,965-8, 48.96 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 24 hours of heating at 175° C. with continuous stirring, an aliquot of the reaction product that had been precipitated into methanol was analyzed by gel permeation chromatography (gpc) (elution solvent was tetrahydrofuran) with the following results: $M_n$ 4464, $M_{peak}$ 7583, $M_w$ 7927, $M_z$ 12,331, and $M_{z+1}$ 16,980. After 48 hours at 175° C. with continuous stirring, the reaction mixture was filtered to remove potassium carbonate and precipitated into methanol (2 gallons). The polymer (poly(4-CPK-BPA)) was isolated in 86% yield after filtration and drying in vacuo. GPC analysis was as follows: $M_n$ 5347, $M_{peak}$ 16,126, $M_w$ 15,596, $M_z$ 29,209, and $M_{z+1}$ 42,710. The glass transition temperature of the polymer was about 120±10° C. as determined using differential scanning calorimetry at a heating rate of 20° C. per minute. As a result of the stoichiometries used in the reaction, it is believed that this polymer had end groups derived from bis-phenol A.

POLYMER SYNTHESIS EXAMPLE II

A polyarylene ether ketone of the formula

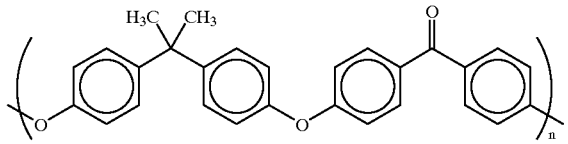

wherein n is between about 2 and about 30 (hereinafter referred to as poly(4-CPK-BPA)) was prepared as follows. A 5 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 250 grams), bis-phenol A (Aldrich 23,965-8, 244.8 grams), potassium carbonate (327.8 grams), anhydrous N,N-dimethylacetamide (1,500 milliliters), and toluene (275 milliliters) were added to the flask and heated to 175° C. (oil bath temperature) while the volatile toluene component was collected and removed. After 48 hours of heating at 175° C. with continuous stirring, the reaction mixture was filtered to remove insoluble salts, and the resultant solution was added to methanol (5 gallons) to precipitate the polymer. The polymer was isolated by filtration, and the wet filter cake was washed with water (3 gallons) and then with methanol (3 gallons). The yield was 360 grams of vacuum dried product. The molecular weight of the polymer was determined by gel permeation chromatography (gpc) (elution solvent was tetrahydrofuran) with the following results: $M_n$ 3,601, $M_{peak}$ 5,377, $M_w$ 4,311, $M_z$ 8,702, and $M_{z+1}$ 12,951. The glass transition temperature of the polymer was between 125 and 155° C. as determined using differential scanning calorimetry at a heating rate of 20° C. per minute dependent on molecular weight. As a result of the stoichiometries used in the reaction, it is believed that this polymer had end groups derived from bis-phenol A.

POLYMER SYNTHESIS EXAMPLE III

Poly(4-CPK-BPA) prepared as described in Polymer Synthesis Example I (10 grams) in 1,1,2,2-tetrachloroethane (100 milliliters, 161.9 grams), paraformaldehyde (5 grams), p-toluene-sulfonic acid monohydrate (1 gram), acrylic acid (15.8 grams), and crushed 4-methoxy-phenol (MEHQ, 0.2 gram) were charged in a 6.5 fluid ounce beverage bottle equipped with a magnetic stirrer. The bottle was stoppered with a rubber septum and was then heated to 105° C. in a silicone oil bath under argon using a needle inlet. The argon needle inlet was removed when the oil bath achieved 90° C. Heating at 105° C. was continued with constant magnetic stirring for 1.5 hours. More MEHQ (0.2 grams) in 1 milliliter of 1,1,2,2-tetrachloroethane was then added by syringe, and heating at 105° C. with stirring was continued for 1.5 hours longer. The reaction mixture was initially a cloudy suspension which become clear on heating. The reaction vessel was immersed as much as possible in the hot oil bath to prevent condensation of paraformaldehyde onto cooler surfaces of the reaction vessel. The reaction mixture was allowed to return to 25° C. and was then filtered through a 25 to 50 micron sintered glass Buchner funnel. The reaction solution was added to methanol (1 gallon) to precipitate the polymer designated poly(acryloylmethyl-4-CPK-BPA), of the formula

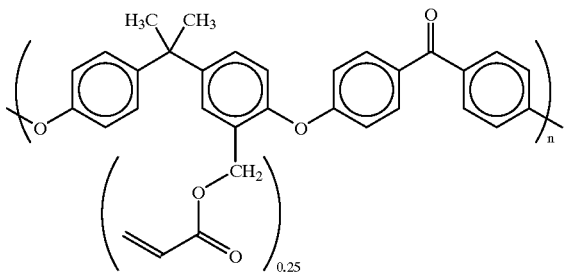

wherein n is between about 6 and about 50. $^1$H NMR spectrometry was used to identify approximately 1 acryloylmethyl group for every four monomer (4-CPK-BPA) repeat units (i.e., a degree of acryloylation of 0.25). The poly(acryloylmethyl-4-CPK-BPA) was then dissolved in methylene chloride and reprecipitated into methanol (1 gallon) to yield 10 grams of fluffy white solid.

POLYMER SYNTHESIS EXAMPLE IV

A solution of chloromethyl ether in methyl acetate was made by adding 282.68 grams (256 milliliters) of acetyl chloride to a mixture of dimethoxy methane (313.6 grams, 366.8 milliliters) and methanol (10 milliliters) in a 5 liter 3-neck round-bottom flask equipped with a mechanical stirrer, argon inlet, reflux condenser, and addition funnel. The solution was diluted with 1,066.8 milliliters of 1,1,2,2-tetrachloroethane and then tin tetrachloride (2.4 milliliters) was added via a gas-tight syringe along with 1,1,2,2-tetrachloroethane (133.2 milliliters) using an addition funnel. The reaction solution was heated to 500° C. Thereafter, a solution of poly(4-CPK-BPA) prepared as described in Polymer Synthesis Example II (160.8 grams) in 1,000 milliliters of tetrachloroethane was added rapidly. The reaction mixture was then heated to reflux with an oil bath set at 110° C. After four hours reflux with continuous stirring, heating was discontinued and the mixture was allowed to cool to 25° C. The reaction mixture was transferred in stages to a 2 liter round bottom flask and concentrated using a rotary evaporator with gentle heating up to 50° C. while reduced pressure was maintained with a vacuum pump trapped with liquid nitrogen. The concentrate was added to methanol (4 gallons) to precipitate the polymer using a Waring blender. The polymer was isolated by filtration and vacuum dried to yield 200 grams of poly(4-CPK-BPA) with 1.5 chloromethyl groups per repeat unit as identified using $^1$H NMR spectroscopy. When the same reaction was carried out for 1, 2, 3, and 4 hours, the amount of chloromethyl groups per repeat unit was 0.76, 1.09, 1.294, and 1.496, respectively.

Solvent free polymer was obtained by reprecipitation of the polymer (75 grams) in methylene chloride (500 grams) into methanol (3 gallons) followed by filtration and vacuum drying to yield 70.5 grams (99.6% theoretical yield) of solvent free polymer.

When the reaction was carried out under similar conditions except that 80.4 grams of poly(4-CPK-BPA) was used instead of 160.8 grams and the amounts of the other reagents were the same as indicated above, the polymer is formed with 1.31, 1.50, 1.75, and 2 chloromethyl groups per repeat unit in 1, 2, 3, and 4 hours, respectively, at 110° C. (oil bath temperature).

When 241.2 grams of poly(4-CPK-BPA) was used instead of 160.8 grams with the other reagents fixed, poly(CPK-BPA) was formed with 0.79, 0.90, 0.98, 1.06, 1.22, and 1.38 chloromethyl groups per repeat unit in 1, 2, 3, 4, 5, and 6 hours, respectively, at 110° C. (oil bath temperature).

When 321.6 grams of poly(4-CPK-BPA) was used instead of 160.8 grams with the other reagents fixed, poly(CPK-BPA) was formed with 0.53, 0.59, 0.64, 0.67, 0.77, 0.86, 0.90, and 0.97 chloromethyl groups per repeat unit in 1, 2, 3, 4, 5, 6, 7, and 8 hours, respectively, at 110° C. (oil both temperature).

POLYMER SYNTHESIS EXAMPLE V

A polyarylene ether ketone of the formula

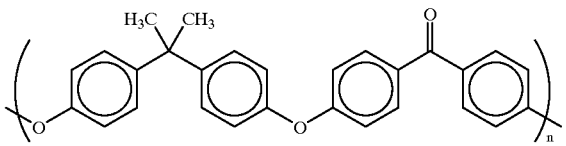

was prepared as described in Polymer Synthesis Example I. A solution of chloromethyl ether in methyl acetate was made by adding 35.3 grams of acetyl chloride to a mixture of dimethoxy methane (45 milliliters) and methanol (1.25 milliliters) in a 500 milliliter 3-neck round-bottom flask equipped with a mechanical stirrer, argon inlet, reflux condenser, and addition funnel. The solution was diluted with 150 milliliters of 1,1,2,2-tetrachloroethane and then tin tetrachloride (0.3 milliliters) was added via syringe. The solution was heated to reflux with an oil bath set at 110° C. Thereafter, a solution of poly(4-CPK-BPA) (10 grams) in 125 milliliters of 1,1,2,2-tetrachloroethane was added over 8 minutes. After two hours reflux with continuous stirring, heating was discontinued and the mixture was allowed to cool to 25° C. The reaction mixture was transferred to a rotary evaporator with gentle heating at between 50 and 55° C. After 1 hour, when most of the volatiles had been removed, the reaction mixture was added to methanol (each 25 milliliters of solution was added to 0.75 liter of methanol) to precipitate the polymer using a Waring blender. The precipitated polymer was collected by filtration, washed with methanol, and air-dried to yield 13 grams of off-white powder. The polymer had about 1.5 $CH_2Cl$ groups per repeat unit.

POLYMER SYNTHESIS EXAMPLE VI

A solution was prepared containing 90 grams of a chloromethylated polymer prepared as described in Polymer Synthesis Example IV with 1.5 chloromethyl groups per repeat unit in 639 milliliters (558.5 grams) of N,N-dimethylacetamide and the solution was magnetically stirred at 25° C. with sodium acrylate (51.39 grams) for 1 week. The reaction mixture was then centrifuged, and the supernate was added to methanol (4.8 gallons) using a Waring blender in relative amounts of 25 milliliters of polymer solution per 0.75 liter of methanol. The white powder that precipitated was filtered, and the wet filter cake was washed with water (3 gallons) and then methanol (3 gallons). The polymer was then isolated by filtration and vacuum dried to yield 73.3 grams of a white powder. The polymer had 3 acrylate groups for every 4 repeating monomer units and 3 chloromethyl groups for every 4 repeating monomer units and a weight average molecular weight of about 25,000.

When the reaction was repeated with poly(4-CPK-BPA) with 2 chloromethyl groups per repeat unit and the other reagents remained the same, the reaction took four days to achieve 0.76 acrylate groups per repeat unit and 1.24 chloromethyl groups per repeat unit.

When the reaction was repeated with poly(4-CPK-BPA) with 1.0 chloromethyl groups per repeat unit and the other reagents remained the same, the reaction took 14-days to achieve 0.75 acrylate groups per repeat unit and 2.5 chloromethyl groups per repeat unit.

POLYMER SYNTHESIS EXAMPLE VII

A chloromethylated polyarylene ether ketone having 1.5 chloromethyl groups per repeat unit was prepared as described in Polymer Synthesis Example IV. A solution containing 10 grams of the chloromethylated polymer in 71 milliliters of N,N-dimethyl acetamide was magnetically stirred with 5.71 grams of sodium acetate (obtained from Aldrich Chemical Co., Milwaukee, WI). The reaction was allowed to proceed for one week. The reaction mixture was then centrifuged and the supernate was added to methanol (0.5 gallon) to precipitate the polymer. The polymer was then filtered, washed with water (2 liters), and subsequently washed with methanol (0.5 gallon). Approximately half of the chloromethyl groups were replaced with methylcarboxymethylene groups, and it is believed that the polymer was of the formula

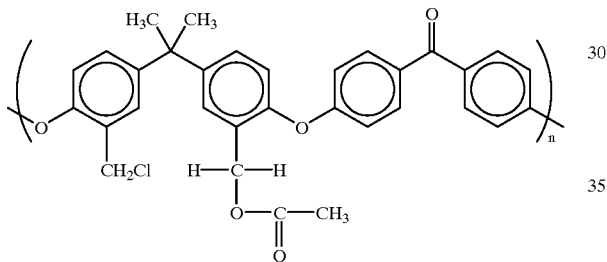

When the process was repeated under similar conditions but allowed to proceed for about 2 weeks, nearly all of the chloromethyl groups were replaced with methylcarboxymethylene groups, and the resulting polymer was believed to be of the formula

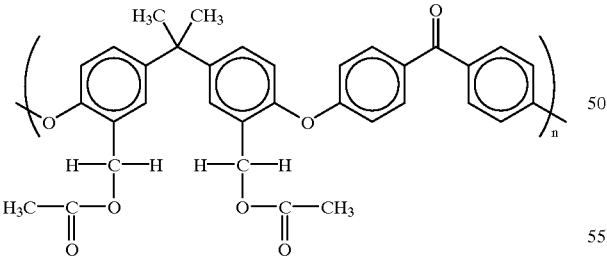

POLYMER SYNTHESIS EXAMPLE VIII

The process of Polymer Synthesis Example VII was repeated except that the 5.71 grams of sodium acetate were replaced with 5.71 grams of sodium methoxide (obtained from Aldrich Chemical Co., Milwaukee, Wis.). After about two hours, approximately half of the chlorine atoms on the chloromethyl groups were replaced with methoxy groups, and it is believed that the polymer was of the formula

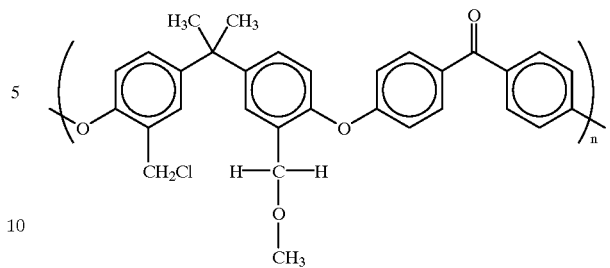

When the process was repeated under similar conditions but allowed to proceed for about 2 weeks, nearly all of the chlorine atoms on the chloromethyl groups were replaced with methoxy groups, and the resulting polymer was believed to be of the formula

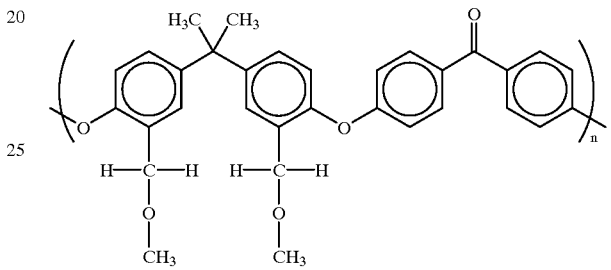

POLYMER SYNTHESIS EXAMPLE IX

A chloromethylated polyarylene ether ketone was prepared as described in Polymer Synthesis Example V. A solution was then prepared containing 11 grams of the chloromethylated polymer in 100 milliliters (87.4 grams) of N,N-dimethylacetamide and the solution was magnetically stirred at 25° C. with sodium acrylate (30 grams) for 1 week. The reaction mixture was then filtered and added to methanol using a Waring blender in relative amounts of 25 milliliters of polymer solution per 0.75 liter of methanol. The white powder that precipitated was reprecipitated into methanol from a 20 weight percent solids solution in methylene chloride and was them air dried to yield 7.73 grams of a white powder. The polymer had 3 acrylate groups for every 4 repeating monomer units and 3 chloromethyl groups for every 4 repeating monomer units.

POLYMER SYNTHESIS EXAMPLE X

A polyarylene ether ketone of the formula

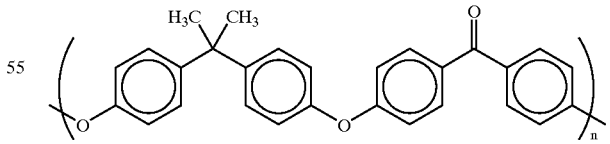

wherein n is between about 6 and about 30 (hereinafter referred to as poly(4-CPK-BPA)) was prepared as follows. A 1 liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 53.90 grams), bis-phenol A (Aldrich 23,965-8, 45.42 grams), potassium carbonate (65.56 grams), anhydrous N,N-dimethylacetamide (300 milliliters), and toluene (55 milliliters) were added to the flask and heated to 175° C. (oil bath temperature) while the volatile toluene component was collected and removed. After 24 hours of heating at 175° C. with continuous stirring, the reaction mixture was filtered to remove potassium carbonate and precipitated into methanol (2 gallons). The polymer (poly (4-CPK-BPA)) was isolated in 86% yield after filtration and drying in vocuo. GPC analysis was as follows: $M_n$ 4,239, $M_{peak}$ 9,164, $M_w$ 10,238, $M_z$ 18,195, and $M_{z+1}$ 25,916. Solution cast films from methylene chloride were clear, tough, and flexible. As a result of the stoichiometries used in the reaction, it is believed that this polymer had end groups derived from 4,4-dichlorobenzophenone.

POLYMER SYNTHESIS EXAMPLE XI

A benzophenone-terminated polyarylene ether ketone prepared as described in Polymer Synthesis Example X was 15 chloromethyl substituted as described in Polymer Synthesis Example IV, resulting in a benzophenone-terminated, chloromethylated polymer having 0.5 chloromethyl groups per repeat unit.

A solution was prepared containing the benzophenone-terminated chloromethylated polyarylene ether ketone thus prepared in N-methylpyrrolidinone at a concentration of 33.7 percent by weight polymer solids. To this solution was added N,N-dimethyl ethyl methacrylate (obtained from Aldrich Chemical Co., Milwaukee, Wis.) in an amount of 6.21 percent by weight of the polymer solution, and the resulting solution was stirred for 2 hours. The reaction of the chloromethyl groups with the N,N-dimethyl ethyl methocrylate occurred quickly, resulting in formation of a polymer having about 0.5 N,N-dimethyl ethyl methacrylate groups per monomer repeat unit.

POLYMER SYNTHESIS EXAMPLE XII

Fifty grams of a polymer having 0.75 acrylate groups per repeat unit and 0.75 chloromethyl groups per repeat unit prepared as described in Polymer Synthesis Example VI is dissolved in 117 milliliters of N,N-dimethylacetamide and magnetically stirred at 5° C. in an ice bath with 30 milliliters of trimethylamine. The reaction mixture is allowed to return to 25° C. over two hours and stirring is continued for an additional two hours. The unreacted trimethylamine is then removed using a rotary evaporator and the resulting polymer has both acrylate substituents and trimethylammonium chloride substituents.

POLYMER SYNTHESIS EXAMPLE XIII

A polymer of the formula

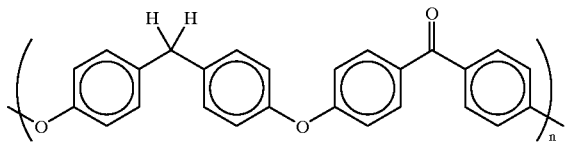

wherein n represents the number of repeating monomer units was prepared as follows. A 500 milliliter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 16.32 grams, 0.065 mol), bis(4-hydroxyphenyl)methane (Aldrich, 14.02 grams, 0.07 mol), potassium carbonate (21.41 grams), anhydrous N,N-dimethylacetamide (100 milliliters), and toluene (100 milliliters) were added to the flask and heated to 175° C. (oil bath temperature) while the volatile toluene component was collected and removed. After 48 hours of heating at 175° C. with continuous stirring, the reaction mixture was filtered and added to methanol to precipitate the polymer, which was collected by filtration, washed with water, and then washed with methanol. The yield of vacuum dried product, poly(4-CPK-BPM), was 24 grams. The polymer dissolved on heating in N-methylpyrrolidinone, N,N-dimethylacetamide, and 1,1,2,2-tetrachloroethane. The polymer remained soluble after the solution had cooled to 25° C.

POLYMER SYNTHESIS EXAMPLE XIV

The polymer poly(4-CPK-BPM), prepared as described in Polymer Synthesis Example XIII, was acryloylated with paraformaldehyde by the process described in Polymer Synthesis Example II. Similar results were obtained.

POLYMER SYNTHESIS EXAMPLE XV

The polymer poly(4-CPK-BPM), prepared as described in Polymer Synthesis Example XIII, was chloromethylated as follows. A solution of chloromethyl methyl ether (6 mmol/milliliter) in methyl acetate was prepared by adding acetyl chloride (35.3 grams) to a mixture of dimethoxymethane (45 milliliters) and methanol (1.25 milliliters). The solution was diluted with 150 milliliters of 1,1,2,2-tetrachloroethane and then tin tetrachloride (0.3 milliliters) was added. After taking the mixture to reflux using an oil bath set at 110° C., a solution of poly(4-CPK-BPM) (10 grams) in 125 milliliters of 1,1,2,2-tetrachloroethane was added. Reflux was maintained for 2 hours and then 5 milliliters of methanol were added to quench the reaction. The reaction solution was added to 1 gallon of methanol using a Waring blender to precipitate the product, chloromethylated poly(4-CPK-BPM), which was collected by filtration and vacuum dried. The yield was 9.46 grams of poly(4-CPK-BPM) with 2 chloromethyl groups per polymer repeat unit. The polymer had the following structure:

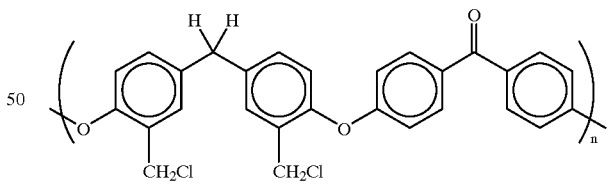

POLYMER SYNTHESIS EXAMPLE XVI

Poly(4-CPK-BPM) with 2 chloromethyl groups per repeat unit (1 gram, prepared as described in Polymer Synthesis Example XV) in 20 milliliters of N,N-dimethylacetamide was magnetically stirred with sodium acrylate for 112 hours at 25° C. The solution was added to methanol using a Waring blender to precipitate the polymer, which was filtered and vacuum dried. Between 58 and 69 percent of the chloromethyl groups had been replaced with acryloyl groups. The product had the following formula:

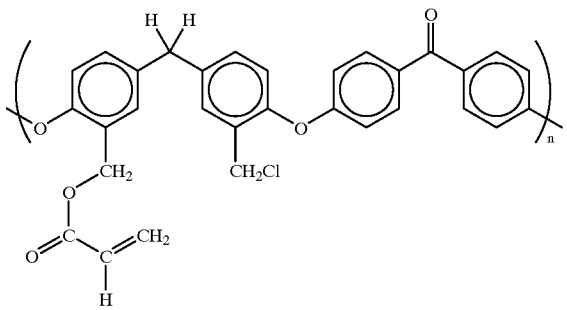

POLYMER SYNTHESIS EXAMPLE XVII

A polymer of the formula

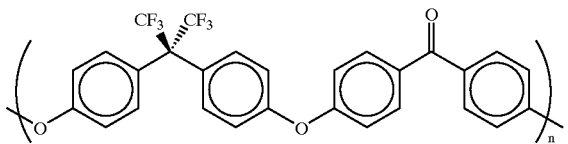

prepared as follows. A 500 milliliter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich 11,370, Aldrich Chemical Co., Milwaukee, Wis., 16.32 grams, 0.065 mol), hexafluorobisphenol A (Aldrich, 23.52 grams, 0.07 mol), potassium carbonate (21.41 grams), anhydrous N,N-dimethylacetamide (100 milliliters), and toluene (100 milliliters) were added to the flask and heated to 175° C. (oil bath temperature) while the volatile toluene component was collected and removed. After 48 hours of heating at 175° C. with continuous stirring, the reaction mixture was filtered and added to methanol to precipitate the polymer, which was collected by filtration, washed with water, and then washed with methanol. The yield of vacuum dried product, poly(4-CPK-HFBPA), was 20 grams. The polymer was analyzed by gel permeation chromatography (gpc) (elution solvent was tetrahydrofuran) with the following results: $M_n$ 1,975, $M_{peak}$ 2,281, $M_w$ 3,588, and $M_{z+1}$ 8,918.

POLYMER SYNTHESIS EXAMPLE XVIII

The polymer poly(4-CPK-HFBPA), prepared as described in Polymer Synthesis Example XVII, was acryloylated with paraformaldehyde by the process described in Polymer Synthesis Example II. Similar results were obtained.

POLYMER SYNTHESIS EXAMPLE XIX

The polymer poly(4-CPK-HFBPA), prepared as described in Polymer Synthesis Example XVII, is chloromethylated by the process described in Polymer Synthesis Example XV. It is believed that similar results will be obtained.

POLYMER SYNTHESIS EXAMPLE XX

The chloromethylated polymer poly(4-CPK-HFBPA), prepared as described in Polymer Synthesis Example XIX, is acryloylated by the process described in Polymer Synthesis Example XVI. It is believed that similar results will be obtained.

POLYMER SYNTHESIS EXAMPLE XXI

A polymer of the formula

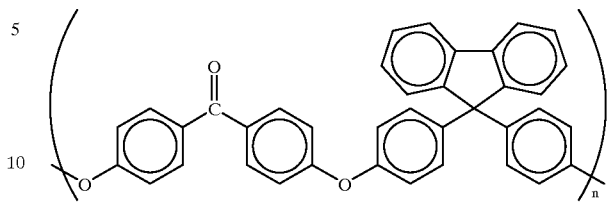

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Difluorobenzophenone (Aldrich Chemical Co., Milwaukee, Wis., 43.47 grams, 0.1992 mol), 9,9'-bis(4-hydroxyphenyl)fluorenone (Ken Seika, Rumson, N.J., 75.06 grams, 0.2145 mol), potassium carbonate (65.56 grams), anhydrous N,N-dimethylacetamide (300 milliliters), and toluene (52 milliliters) were added to the flask and heated to 175° C. (oil bath temperature) while the volatile toluene component was collected and removed. After 5 hours of heating at 175° C. with continuous stirring, the reaction mixture was allowed to cool to 25° C. The solidified mass was treated with acetic acid (vinegar) and extracted with methylene chloride, filtered, and added to methanol to precipitate the polymer, which was collected by filtration, washed with water, and then washed with methanol. The yield of vacuum dried product, poly(4-FPK-FBPA), was 71.7 grams. The polymer was analyzed by gel permeation chromatography (gpc) (elution solvent was tetrahydrofuran) with the following results: $M_n$ 59,100, $M_{peak}$ 144,000, $M_w$ 136,100, $M_z$ 211,350, and $M_{z+1}$ 286,100.

POLYMER SYNTHESIS EXAMPLE XXII

A polymer of the formula

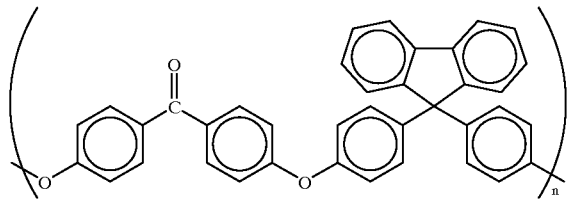

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Dichlorobenzophenone (Aldrich Chemical Co., Milwaukee, Wis., 50.02 grams, 0.1992 mol), 9,9'-bis(4-hydroxyphenyl)fluorenone (Ken Seika, Rumson, N.J., 75.04 grams, 0.2145 mol), potassium carbonate (65.56 grams), anhydrous N,N-dimethylacetamide (300 milliliters), and toluene (52 milliliters) were added to the flask and heated to 175° C. (oil bath temperature) while the volatile toluene component was collected and removed. After 24 hours of heating at 175° C. with continuous stirring, the reaction mixture was allowed to cool to 25° C. The reaction mixture was filtered and added to methanol to precipitate the polymer, which was collected by filtration, washed with water, and then washed with methanol. The yield of vacuum dried product, poly(4-CPK-FBP), was 60 grams.

POLYMER SYNTHESIS EXAMPLE XXIII

The polymer poly(4-CPK-FBP), prepared as described in Polymer Synthesis Example XXII, was chloromethylated as follows. A solution of chloromethyl methyl ether (6 mmol/milliliter) in methyl acetate was prepared by adding acetyl chloride (38.8 grams) to a mixture of dimethoxymethane (45 milliliters) and methanol (1.25 milliliters). The solution was diluted with 100 milliliters of 1,1,2,2-tetrachloroethane and then tin tetrachloride (0.5 milliliters) was added in 50 milliliters of 1,1,2,2-tetrachloroethane. After taking the mixture to reflux using an oil bath set at 100° C., a solution of poly(4-CPK-FBP) (10 grams) in 125 milliliters of 1,1,2,2-tetrachloroethane was added. The reaction temperature was maintained at 100° C. for 1 hour and then 5 milliliters of methanol were added to quench the reaction. The reaction solution was added to 1 gallon of methanol using a Waring blender to precipitate the product, chloromethylated poly(4-CPK-FBP), which was collected by filtration and vacuum dried. The yield was 9.5 grams of poly(4-CPK-FBP) with 1.5 chloromethyl groups per polymer repeat unit. When the reaction was carried out at 110° C. (oil bath set temperature), the polymer gelled within 80 minutes. The polymer had the following structure:

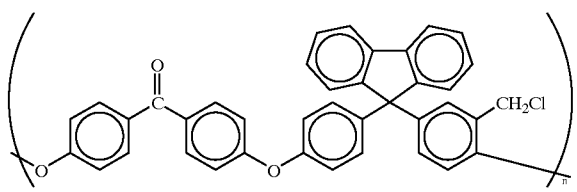

POLYMER SYNTHESIS EXAMPLE XXIV

Poly(4-CPK-FBP) with 1.5 chloromethyl groups per repeat unit (1 gram, prepared as described in Polymer Synthesis Example XXIII) in 20 milliliters of N,N-dimethylacetamide was magnetically stirred with sodium acrylate for 112 hours at 25° C. The solution was added to methanol using a Waring blender to precipitate the polymer, which was filtered and vacuum dried. About 50 percent of the chloromethyl groups had been replaced with acryloyl groups. The product had the following formula:

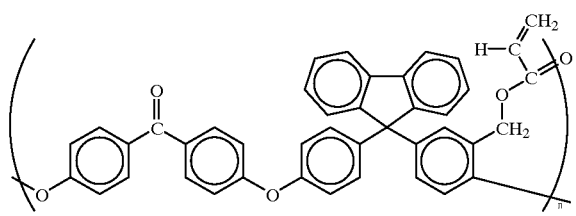

POLYMER SYNTHESIS EXAMPLE XXV

A polymer of the formula

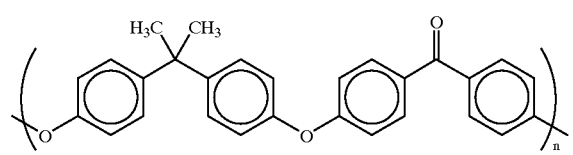

wherein n represents the number of repeating monomer units was prepared as follows. A 1-liter, 3-neck round-bottom flask equipped with a Dean-Stark (Barrett) trap, condenser, mechanical stirrer, argon inlet, and stopper was situated in a silicone oil bath. 4,4'-Difluorobenzophenone (Aldrich Chemical Co., Milwaukee, Wis., 16.59 grams), bisphenol A (Aldrich 14.18 grams, 0.065 mol), potassium carbonate (21.6 grams), anhydrous N,N-dimethylacetamide (100 milliliters), and toluene (30 milliliters) were added to the flask and heated to 175° C. (oil bath temperature) while the volatile toluene component was collected and removed. After 4 hours of heating at 175° C. with continuous stirring, the reaction mixture was allowed to cool to 25° C. The solidified mass was treated with acetic acid (vinegar) and extracted with methylene chloride, filtered, and added to methanol to precipitate the polymer, which was collected by filtration, washed with water, and then washed with methanol. The yield of vacuum dried product, poly(4-FPK-BPA), was 12.22 grams. The polymer was analyzed by gel permeation chromatography (gpc) (elution solvent was tetrahydrofuran) with the following results: $M_n$ 5,158, $M_{peak}$ 15,080, $M_w$ 17,260, and $M_{z+1}$ 39,287. To obtain a lower molecular weight, the reaction can be repeated with a 15 mol % offset in stoichiometry.

POLYMER SYNTHESIS EXAMPLE XXVI

A polymer of the formula

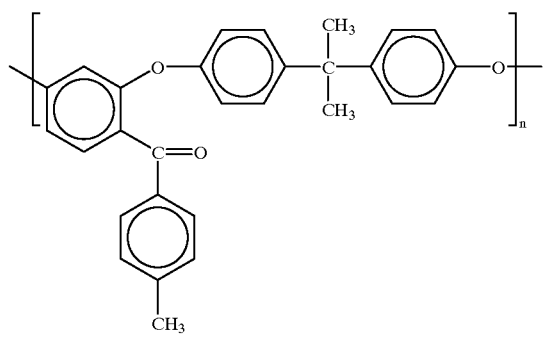

wherein n represents the number of repeating monomer units was prepared as follows. A 250 milliliter, 3-neck round-bottom flask equipped with a Dean-Stark (Barrett) trap, condenser, mechanical stirrer, argon inlet, and stopper was situated in a silicone oil bath. 4'-Methylbenzoyl-2,4-dichlorobenzene (0.0325 mol, 8.6125 grams), bis-phenol A (Aldrich 23,965-8, 0.035 mol, 7.99 grams), potassium carbonate (10.7 grams), anhydrous N,N-dimethylacetamide (60 milliliters), and toluene (60 milliliters, 49.1 grams) were added to the flask and heated to 175° C. (oil bath temperature) while the volatile toluene component was collected and removed. After 24 hours of heating at 175° C. with continuous stirring, the reaction product was filtered and the filtrate was added to methanol to precipitate the polymer. The wet polymer cake was isolated by filtration, washed with water, then washed with methanol, and thereafter vacuum dried. The polymer (7.70 grams, 48% yield) was analyzed by gel permeation chromatography (gpc) (elution solvent was tetrahydrofuran) with the following results: $M_n$ 1,898, $M_{peak}$ 2,154, $M_w$ 2,470, $M_z$ 3,220, and $M_{z+1}$ 4,095.

POLYMER SYNTHESIS EXAMPLE XXVII

A polymer of the formula

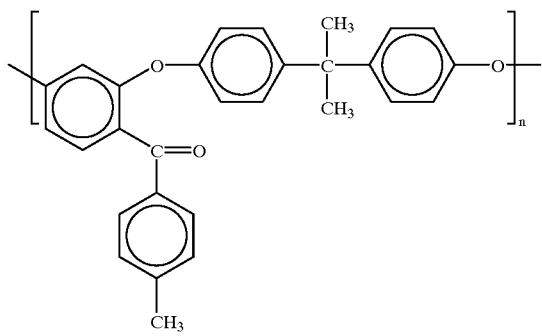

wherein n represents the number of repeating monomer units was prepared by repeating the process of Polymer Synthesis Example XXVI except that the 4'-methylbenzoyl-2,4-dichlorobenzene starting material was replaced with 8.16 grams (0.0325 mol) of benzoyl-2,4-dichlorobenzene and the oil bath was heated to 170° C. for 24 hours.

POLYMER SYNTHESIS EXAMPLE XXVIII

Chloromethylated phenoxy resins, polyethersulfones, and polyphenylene oxides are prepared by reacting the unsubstituted polymers with fin tetrachloride and 1-chloromethoxy-4-chlorobutane as described by W. H. Daly et al. in Polymer Preprints, 20(1), 835 (1979), the disclosure of which is totally incorporated herein by reference. The chloromethylation of polyethersulfone and polyphenylene oxide can also be accomplished as described by V. Percec et al. in *Makromol. Chem.*, 185, 2319 (1984), the disclosure of which is totally incorporated herein by reference.

Acryloylated polymers are then prepared as follows:

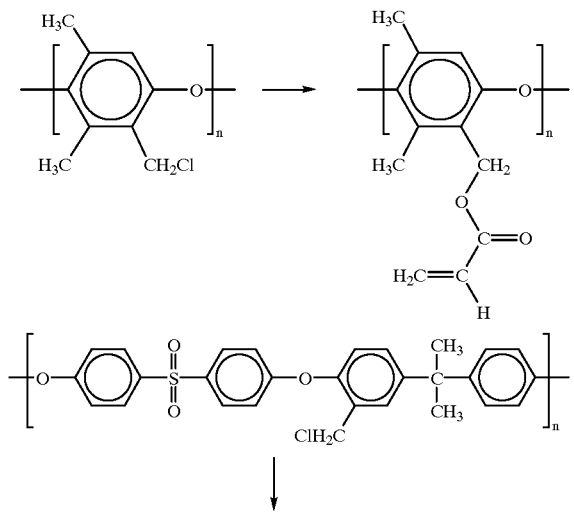

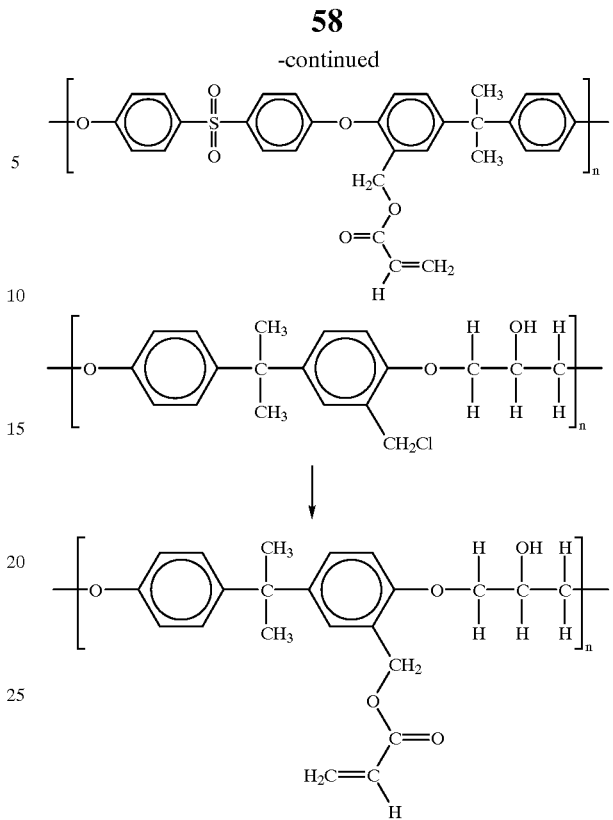

The chloromethylated polymers are acryloylated by allowing the chloromethylated polymer (10 grams) in N,N-dimethylacetamide (71 milliliters) to react with acrylic acid sodium salt (5.14 grams) for between 3 and 20 days, depending on the degree of acryloylation desired. Longer reaction times result in increased acrylate functionality.

POLYMER SYNTHESIS EXAMPLE XXIX

Poly(4-CPK-BPA) is made with a number average molecular weight of 2,800 as follows. A 5-liter, 3-neck round-bottom flask equipped with a Dean-Stark (Barrett) trap, condenser, mechanical stirrer, argon inlet, and stopper is situated in a silicone oil bath. 4,4-Dichlorobenzophenone (Aldrich 11,370, Aldrich Chemical Co., Milwaukee, Wis., 250 grams), bis-phenol A (Aldrich 23,965-8, 244.8 grams). potassium carbonate (327.8 grams), anhydrous N,N-dimethylacetamide (1,500 milliliters), and toluene (275 milliliters) are added to the flask and heated to 175° C. (oil bath temperature) while the volatile toluene component is collected and removed. After hours of heating 30 hours at 175° C. with continuous stirring, the reaction mixture is filtered to remove insoluble salts, and the resultant solution is added to methanol (5 gallons) to precipitate the polymer. The polymer is isolated by filtration, and the wet filter cake is washed with water (3 gallons) and then with methanol (3 gallons). The yield is about 360 grams of vacuum dried polymer. It is believed that if the molecular weight of the polymer is determined by gel permeation chromatography (gpc) (elution solvent was tetrahydrofuran) the following results will be obtained: $M_n$ 2,800, $M_{peak}$ 5,800, $M_w$ 6,500, $M_z$ 12,000 and $M_{z+1}$ 17,700. As a result of the stoichiometries used in the reaction, it is believed that this polymer has end groups derived from bis-phenol A.

The polymer is then chloromethylated as follows. A solution of chloromethyl ether in methyl acetate is made by adding 282.68 grams (256 milliliters) of acetyl chloride to a mixture of dimethoxy methane (313.6 grams, 366.8 milliliters) and methanol (10 milliliters) in a 5-liter 3-neck round-bottom flask equipped with a mechanical stirrer, argon inlet, reflux condenser, and addition funnel. The solution is diluted with 1,066.8 milliliters of 1,1,2,2-tetrachloroethane and then tin tetrachloride (2.4 milliliters) is added via a gas-tight syringe, along with 1,1,2,2-tetrachloroethane (133.2 milliliters) using an addition funnel. The reaction solution is heated to 50° C. and a solution of poly(4-CPK-BPA) (160.8 grams) in 1,1,2,2-tetrachloroethane (1,000 milliliters) is rapidly added. The reaction mixture is then heated to reflux with an oil bath set at 110° C. After four hours reflux with continuous stirring, heating is discontinued and the mixture is allowed to cool to 25° C. The reaction mixture is transferred in stages to a 2 liter round bottom flask and concentrated using a rotary evaporator with gentle heating up to 50° C. and reduced pressure maintained with a vacuum pump trapped with liquid nitrogen. The concentrate is added to methanol (6 gallons) to precipitate the polymer using a Waring blender. The polymer is isolated by filtration and vacuum dried to yield 200 grams of poly(4-CPK-BPA) with 1.5 chloromethyl groups per repeat unit. Solvent free polymer is obtained by reprecipitation of the polymer (75 grams) dissolved in methylene chloride (500 grams) into methanol (3 gallons) followed by filtration and vacuum drying to yield 70.5 grams (99.6% yield) of solvent free polymer. To a solution of the chloromethylated poly(4-CPK-BPA) (192 mmol of chloromethyl groups) in 80 milliliters of dioxane is added 12 grams (46 mmol) of triphenylphosphine. After 15 hours of reflux with mechanical stirring and cooling to 25° C., the polymer solidifies and the mixture is extracted with diethyl ether using a Waring blender. The yellow product is filtered, washed several times with diethyl ether, and vacuum dried. To a solution of triphenylphosphonium chloride salt of chloromethylated poly(4-CPK-BPA) (14 mmol of phosphonium groups) in 200 milliliters of methanol, 2 milliliters of Triton B (40 weight percent aqueous solution) and 11.5 milliliters (140 mmol) of formaldehyde (37 weight percent aqueous solution) are added. The stirred reaction mixture is treated slowly with 36 milliliters of 50 weight percent aqueous sodium hydroxide. A precipitate starts to appear on addition of the first drops of sodium hydroxide solution. After 10 hours of reaction at 25° C., the precipitate is filtered and vacuum dried. The separated polymer is dissolved in methylene chloride, washed several times with water, and then precipitated with methanol. Alternatively, to a solution of solution of 1.8 mmol of phosphonium groups of the triphenylphosphonium chloride salt chloromethylated poly (4-CPK-BPA) in 40 milliliters of methylene chloride at ice-water temperature, 1.6 milliliters (19.5 mmol) of formaldehyde (37 weight percent aqueous solution), and 0.4 milliliters of Triton-B (40 weight percent aqueous solution) is added. The stirred reaction mixture is treated slowly with 5 milliliters (62.5 mmol) of 50 weight percent aqueous sodium hydroxide. After all the hydroxide solution is added, the reaction mixture is allowed to react at 25° C. After 7 hours of reaction, the organic layer is separated, washed with dilute hydrochloric acid, then washed with water, and then precipitated into methanol from chloroform. The polymer has the structure:

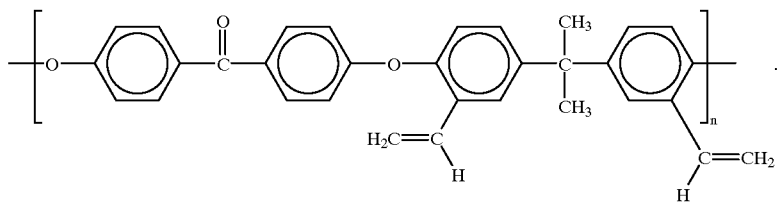

Other embodiments and modifications of the present invention may occur to those of ordinary skill in the art subsequent to a review of the information presented herein; these embodiments and modifications, as well as equivalents thereof, are also included within the scope of this invention.

What is claimed is:

1. A process for bonding a first article to a second article which comprises (a) providing a first article comprising a polymer having photosensitivity-imparting substituents; (b) providing a second article comprising metal, plasma nitride, silicon, or glass; (c) applying to at least one of the first article and the second article an adhesion promoter selected from silanes, titanates, or zirconates having (i) alkoxy, aryloxy, or arylalkyloxy functional groups and (ii) functional groups including at least one photosensitive aliphatic >C=C< linkage; (d) placing the first article in contact with the second article; and (e) exposing the first article, second article, and adhesion promoter to radiation, thereby bonding the first article to the second article with the adhesion promoter.

2. A process according to claim 1 wherein the photosensitive aliphatic >C=C< linkage is selected from the group consisting of unsaturated esters, allyl groups, vinyl groups, and mixtures thereof.

3. A process according to claim 1 wherein the adhesion promoter is selected from the group consisting of those of the general formulae

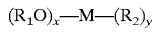

and

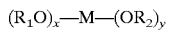

wherein M is Si, Ti, or Zr, x and y are each integers of 1, 2, or 3, wherein the sum of x+y is from 4 to 6, $R_1$ is an alkyl group, an aryl group, or an arylalkyl group, and $R_2$ is an unsaturated alkyl group or an unsaturated arylalkyl group.

4. A process according to claim 1 wherein the adhesion promoter is selected from the group consisting of

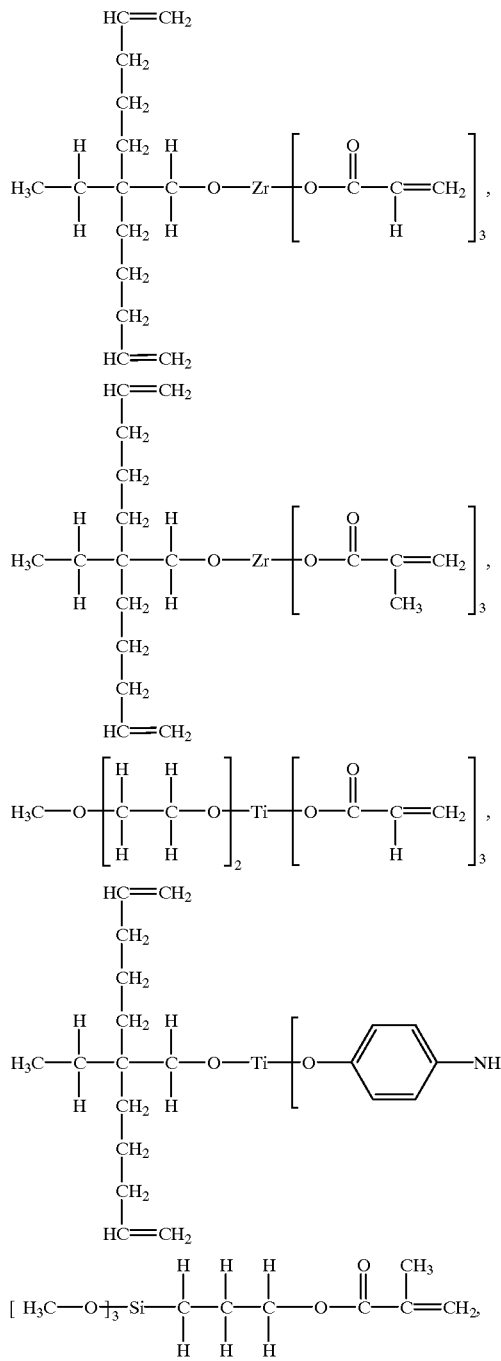

and mixtures thereof.

5. A process according to claim 1 wherein the photosensitivity-imparting substituents are selected from the group consisting of unsaturated ester groups, alkylcarboxymethylene groups, allyl groups, vinyl groups, unsaturated ether groups, unsaturated ammonium groups, unsaturated phosphonium groups, halomethyl groups, and mixtures thereof.

6. A process according to claim 1 wherein the polymer having photosensitivity-imparting substituents is of the general formula

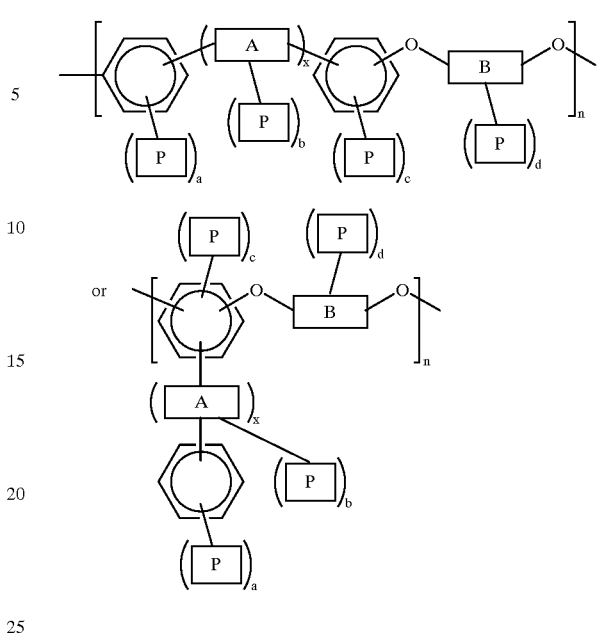

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

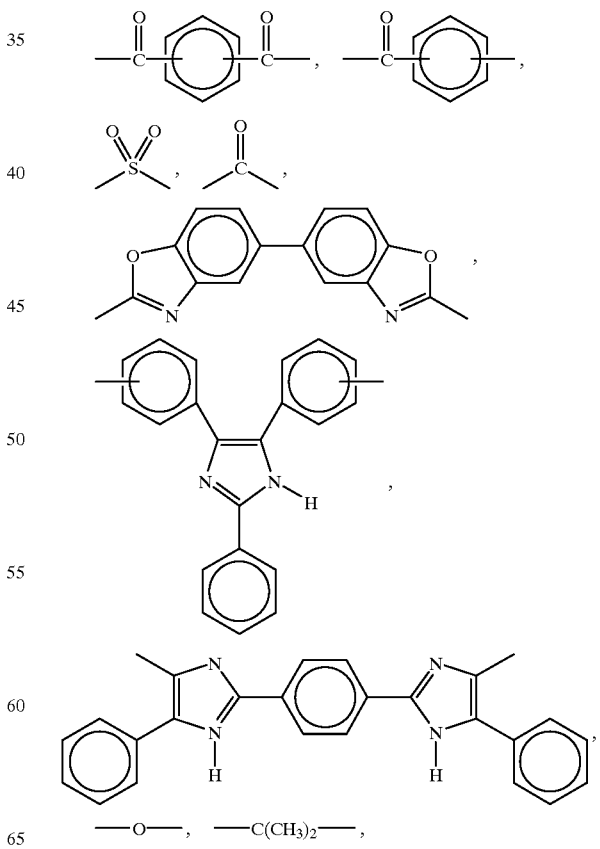

—O—,  —C(CH$_3$)$_2$—, or mixtures thereof, B is
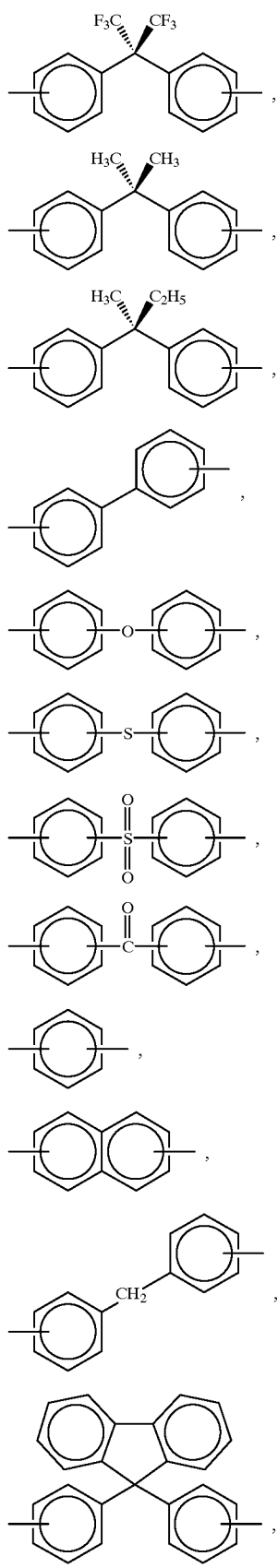
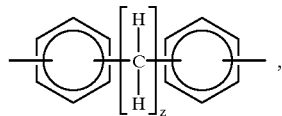
wherein v is an integer of from 1 to about 20,
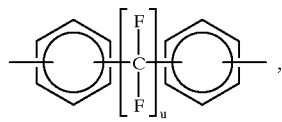
wherein z is an integer of from 2 to about 20,
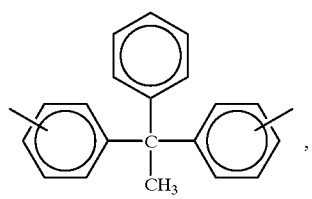
wherein u is an integer of from 1 to about 20,
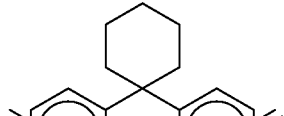
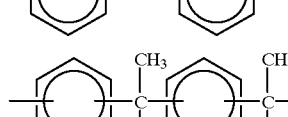
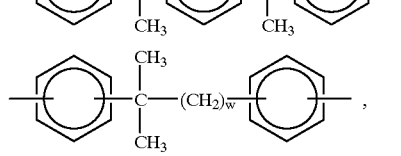
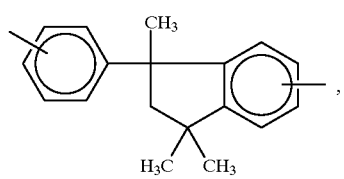
wherein w is an integer of from 1 to about 20,
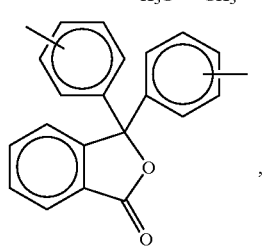

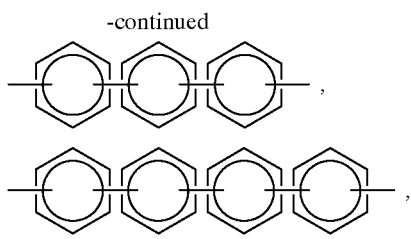

or mixtures thereof, and n is an integer representing the number of repeating monomer units.

7. A process according to claim 6 wherein A is

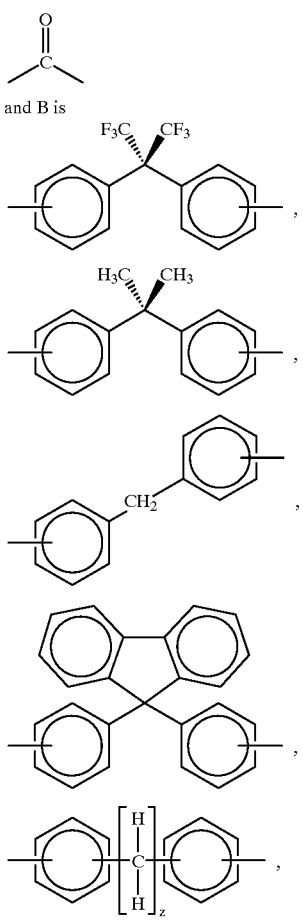

wherein z is an integer of from 2 to about 20, or a mixture thereof.

8. A process according to claim 1 wherein the radiation is heat, electron beam radiation, ultraviolet light, x-ray radiation, or mixtures thereof.

9. A process according to claim 1 wherein the radiation is ultraviolet light.

10. A process for bonding a first article to a second article which comprises (a) providing a first article comprising a polymer having photosensitivity-imparting substituents and an adhesion promoter selected from silanes, titanates, or zirconates having (i) alkoxy, aryloxy, or arylalkyloxy functional groups and (ii) functional groups including at least one photosensitive aliphatic >C=C< linkage; (b) providing a second article comprising metal, plasma nitride, silicon, or glass; (c) placing the first article in contact with the second article; and (d) exposing the first article and second article to radiation, thereby bonding the first article to the second article.

11. A process according to claim 10 wherein the photosensitive aliphatic >C=C< linkage is selected from the group consisting of unsaturated esters, allyl groups, vinyl groups, and mixtures thereof.

12. A process according to claim 10 wherein the adhesion promoter is selected from the group consisting of those of the general formulae $$(R_1O)_x\text{---}M\text{---}(R_2)_y$$

and $$(R_1O)_x\text{---}M\text{---}(OR_2)_y$$

wherein M is Si, Ti, or Zr, x and y are each integers of 1, 2, or 3, wherein the sum of x+y is from 4 to 6, $R_1$ is an alkyl group, an aryl group, or an arylalkyl group, and $R_2$ is an unsaturated alkyl group or an unsaturated arylalkyl group.

13. A process according to claim 10 wherein the adhesion promoter is selected from the group consisting of

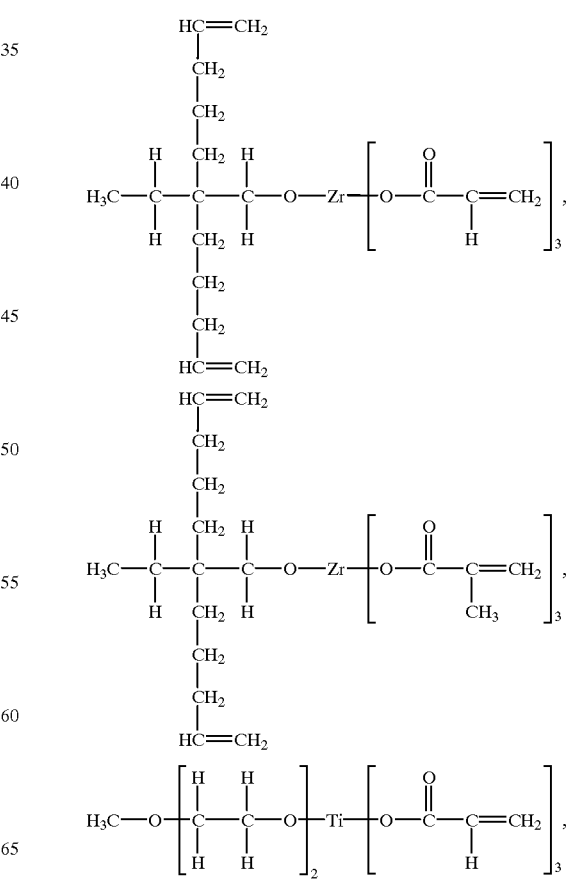

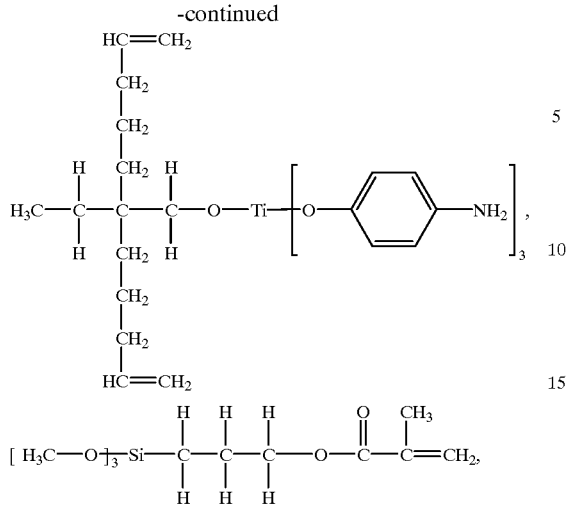

and mixtures thereof.

14. A process according to claim 10 wherein the photosensitivity-imparting substituents are selected from the group consisting of unsaturated ester groups, alkylcarboxymethylene groups, allyl groups, vinyl groups, unsaturated ether groups, unsaturated ammonium groups, unsaturated phosphorium groups, halomethyl groups, and mixtures thereof.

15. A process according to claim 10 wherein the polymer having photosensitivity-imparting substituents is of the general formula

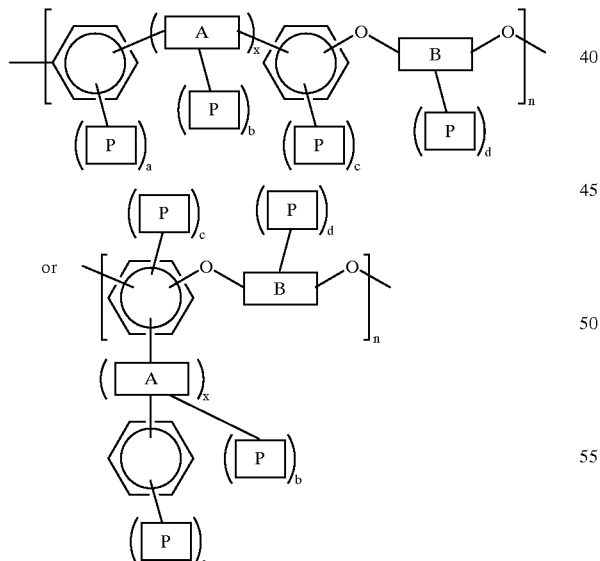

wherein x is an integer of 0 or 1, P is a substituent which imparts photosensitivity to the polymer, a, b, c, and d are each integers of 0, 1, 2, 3, or 4, provided that at least one of a, b, c, and d is equal to or greater than 1 in at least some of the monomer repeat units of the polymer, A is

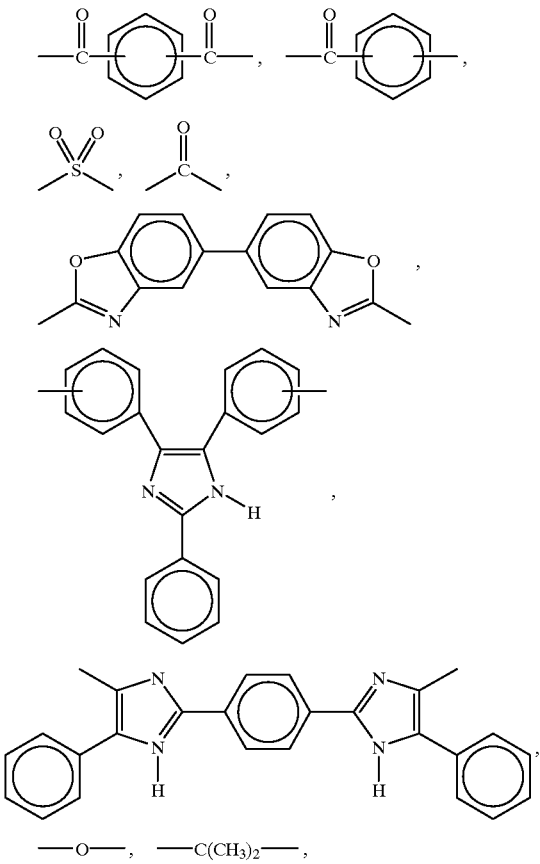

or mixtures thereof, B is

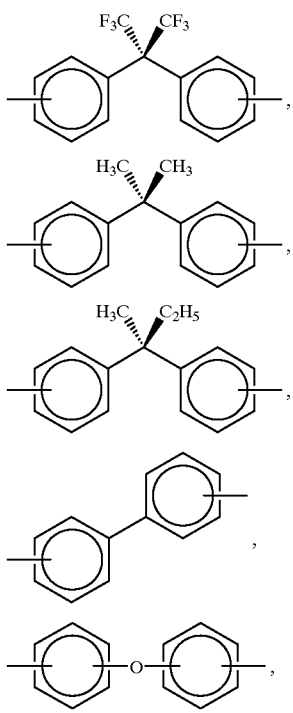

-continued
wherein v is an integer of from 1 to about 20,
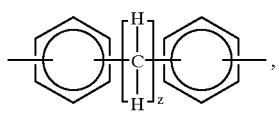
wherein z is an integer of from 2 to about 20,
wherein u is an integer of from 1 to about 20,
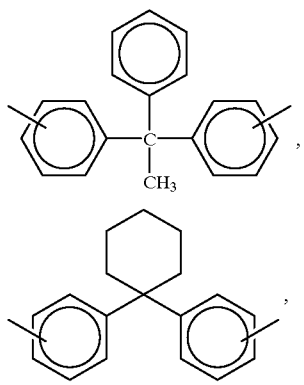
-continued
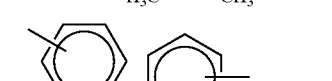
wherein w is an integer of from 1 to about 20,
or mixtures thereof, and n is an integer representing the number of repeating monomer units.
16. A process according to claim 15 wherein A is
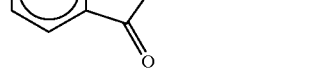 and B is
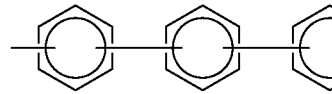

-continued
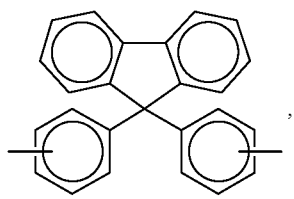,
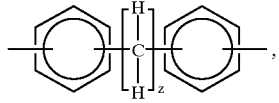,
wherein z is an integer of from 2 to about 20, or a mixture thereof.
17. A process according to claim 10 wherein the radiation is heat, electron beam radiation, ultraviolet light, x-ray radiation, or mixtures thereof.
18. A process according to claim 10 wherein the radiation is ultraviolet light.
* * * * *